(12) United States Patent
Park et al.

(10) Patent No.: US 7,803,672 B2
(45) Date of Patent: Sep. 28, 2010

(54) THIN FILM TRANSISTOR ARRAY PANEL AND METHOD OF MANUFACTURING THE SAME

(75) Inventors: Kyung-Min Park, Seongnam-si (KR); Jin-Goo Jung, Seoul (KR); Chun-Gi You, Yongin-si (KR); Jae-Byoung Chae, Hwaseong-si (KR); Tae-Ill Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/433,743

(22) Filed: Apr. 30, 2009

(65) Prior Publication Data

US 2010/0068841 A1 Mar. 18, 2010

Related U.S. Application Data

(63) Continuation of application No. 11/229,245, filed on Sep. 15, 2005, now Pat. No. 7,528,021.

(30) Foreign Application Priority Data

Sep. 16, 2004 (KR) .................. 10-2004-0074120
Sep. 24, 2004 (KR) .................. 10-2004-0077068

(51) Int. Cl.
*H01L 21/00* (2006.01)
(52) U.S. Cl. .................. 438/153; 438/154; 438/401; 257/E21.32
(58) Field of Classification Search ............... 438/151, 438/153–154, 157, 283, 401, 149; 257/E21.32
See application file for complete search history.

(56) References Cited

U.S. PATENT DOCUMENTS 6,338,988 B1 * 1/2002 Andry et al. ................. 438/158

6,429,483 B1    8/2002  Teramoto

FOREIGN PATENT DOCUMENTS

| JP | 6-181178 | 6/1994 |
|---|---|---|
| JP | 11-97712 | 4/1999 |
| JP | 2000-22157 | 1/2000 |
| JP | 2000-315802 | 11/2000 |
| KR | 2002-0060113 | 7/2002 |
| KR | 2003-0016052 | 2/2003 |
| KR | 2003-0058613 | 7/2003 |
| KR | 10-2004-0013273 | 2/2004 |

OTHER PUBLICATIONS

Patent Abstracts of Japan, Publication No. 06-181178, Jun. 28, 1994, 1 p.
Patent Abstracts of Japan, Publication No. 11-097712, Apr. 9, 1999, 1 p.

(Continued)

*Primary Examiner*—Thanhha Pham
(74) *Attorney, Agent, or Firm*—Innovation Counsel LLP

(57) ABSTRACT

A method of manufacturing a thin film transistor array panel is provided, which includes: forming a semiconductor layer of polysilicon on an insulating substrate; forming a gate insulating layer on the semiconductor layer; forming a gate electrode on the gate insulating layer; forming a source region and a drain region by doping conductive impurities in the semiconductor layer; forming an interlayer insulating layer covering the gate electrode; forming a source electrode and a drain electrode respectively connected to the source and the drain regions; forming a passivation layer covering the source and the drain electrodes; forming a pixel electrode connected to the drain electrode; and forming a first alignment key when forming one selected from the semiconductor layer, the gate electrode, the source and the drain electrodes, and the pixel electrode, wherein one selected from the semiconductor layer, the gate electrode, the source and the drain electrodes, and the pixel electrode is at least formed by photolithography process using a photoresist pattern as an etch mask, and a second alignment key completely covering the first alignment key is formed at the same layer as the photoresist pattern.

6 Claims, 37 Drawing Sheets

OTHER PUBLICATIONS

Patent Abstracts of Japan, Publication No. 2000-022157, Jan. 21, 2000, 1 p.
Patent Abstracts of Japan, Publication No. 2000-315802, Nov. 14, 2000, 1 p.
Korean Patent Abstracts, Publication No. 1020020060113, Jul. 16, 2002, 1 p.
Korean Patent Abstracts, Publication No. 1020030016052, Feb. 26, 2003, 1 p.
Korean Patent Abstracts, Publication No. 1020030058613, Jul. 7, 2003, 1 p.
Korean Patent Abstracts, Publication No. 1020040013273, Feb. 14, 2004, 1 p.

* cited by examiner

THIN FILM TRANSISTOR ARRAY PANEL AND METHOD OF MANUFACTURING THE SAME

CROSS-REFERENCE TO RELATED APPLICATIONS

The present application is a continuation application of U.S. patent application Ser. No. 11/229,245 filed on Sep. 15, 2005, which claims the benefit of Korean Patent Application No. 10-2004-0074120 filed on Sep. 16, 2004 and Korean Patent Application No. 10-2004-0077068 filed on Sep. 24, 2004 in the Korean Intellectual Property Office, the disclosures of which are incorporated herein by reference.

BACKGROUND OF THE INVENTION (a) Field of the Invention

The present invention relates to a thin film transistor array panel and a method of manufacturing the same.

(b) Description of Related Art

A thin film transistor array panel is used with a circuit panel of a flat display such as a liquid crystal display (LCD) and an organic light emitting display (OLED). The thin film transistor array panel includes a plurality of pixel electrodes, a plurality of thin film transistors (TFTs) connected thereto, and a plurality of signal lines connected to the TFTs.

The signal lines include gate lines for transmitting gate signals from the drivers to the TFTs and data lines for transmitting data signals from the drivers to the TFTs.

A TFT includes a semiconductor layer of amorphous silicon or polysilicon, a gate electrode connected to the gate line, a source electrode connected to the data line, and a drain electrode connected to the pixel electrode.

A polysilicon TFT using polysilicon for a semiconductor layer has relatively high electron mobility compared to an amorphous silicon TFT, and the polysilicon TFT enables implementation of a chip in glass technique in which a display panel has its driving circuits imbedded therein.

Excimer laser annealing (ELA) and chamber annealing are typical methods for producing polycrystalline silicon. Recently, a sequential lateral solidification (SLS) process has been proposed. The SLS technique utilizes a phenomenon in which the silicon grains grow laterally to a boundary of a liquid region and a solid region.

In the manufacturing method of the thin film transistor array panel, multi-layered thin films including a plurality of conductive layers and a plurality of insulating layers are patterned through a photolithography process, and alignment keys for interlayer alignment of the multi-layered thin films are used to accurately position them. The location of the alignment keys is detected during manufacture, and a plurality of photoresist patterns for the multi-layered thin films are also aligned with alignment keys formed at the same layer as the photoresist pattern.

However, the grains grow until they meet each other in the SLS process and protrusions are formed at the positions where the grains meet, and consequently the protrusions generate interlayer misalignment. That is to say, when the protrusions have a large step, the step may cause detection noise when detecting the steps of the alignment keys in the manufacturing process, preventing detection of the align key, and thereby generating the interlayer misalignment.

Furthermore, because the gate insulating layer is deposited after patterning the polysilicon layer in the conventional manufacturing method, the surface of the polysilicon layer is contaminated when the photoresist is baked after coating the photoresist on the polysilicon. To solve this problem, a cleaning process may be executed. However, because the contamination should be completely removed, qualities of thin film transistor are deteriorated and become nonuniform, thereby decreasing the display characteristics of the display device.

SUMMARY OF THE INVENTION

The present invention provides a thin film transistor array panel and a manufacturing method thereof that uniformly enhance the characteristics of thin film transistors, and prevent interlayer misalignment by minimizing detection noise of the protrusions.

A method of manufacturing a thin film transistor array panel is provided, which includes: forming a semiconductor layer of polysilicon on an insulating substrate; forming a gate insulating layer on the semiconductor layer; forming a gate electrode on the gate insulating layer; forming a source region and a drain region by doping conductive impurities in the semiconductor layer; forming an interlayer insulating layer covering the gate electrode; forming a source electrode and a drain electrode respectively connected to the source and the drain electrodes; forming a passivation layer covering the source and the drain electrodes; forming a pixel electrode connected to the drain electrode; and forming a first alignment key when forming one selected from the semiconductor layer, the gate electrode, the source and the drain electrodes, and the pixel electrode, wherein one selected from the semiconductor layer, the gate electrode, the source and the drain electrodes, and the pixel electrode is at least formed by a photolithography process using a photoresist pattern as an etch mask, and a second alignment key completely covering the first alignment key is formed at the same layer as the photoresist pattern.

The first alignment key may include a display portion representing the shape of the first alignment key, a detection portion defining the outline of the first alignment key, and a circumferential portion disposed between the display portion and the detection portion.

The detection portion may be made in relief or in intaglio.

The thin film transistor array panel may be a display panel for a liquid crystal display or an organic light emitting display.

A method of manufacturing a thin film transistor array panel is provided, which includes: forming a polysilicon layer on an insulating substrate; depositing an insulating layer on the polysilicon layer; patterning the polysilicon layer and the insulating layer to form a semiconductor layer of polysilicon and a first gate insulating layer of the insulating layer; forming a second gate insulating layer covering the semiconductor layer; forming a gate electrode on the second gate insulating layer; forming a source region and a drain region by doping conductive impurities in the semiconductor layer; forming an interlayer insulating layer covering the gate electrode; forming a source electrode and a drain electrode respectively connected to the source and the drain regions; forming a passivation layer covering the source and the drain electrodes; and forming a pixel electrode connected to the drain electrode.

The method may further include removing the first gate insulating layer before forming the second gate insulating layer.

The thin film transistor array panel may be a display panel for a liquid crystal display or an organic light emitting display.

A method of manufacturing a thin film transistor array panel is provided, which includes: forming a semiconductor of a polysilicon layer on an insulating substrate; forming a gate insulating layer on the semiconductor; forming a gate electrode on the gate insulating layer; forming a source region and a drain region by doping conductive impurities in the semiconductor layer; forming an interlayer insulating layer covering the gate electrode; forming a source electrode and a drain electrode respectively connected to the source and the drain regions; forming a passivation layer covering the source and the drain electrodes; forming a pixel electrode connected to the drain electrode; and forming a first alignment key when forming one selected from the semiconductor, the gate electrode, the source and the drain electrodes, and the pixel electrode, wherein the first alignment key includes a detection portion defining the outline of the first alignment key made in relief, and a circumferential portion defining the boundary of the detection portion and made in intaglio.

One selected from the semiconductor, the gate electrode, the source and the drain electrodes, and the pixel electrode may be at least formed by a photolithography process using a photoresist pattern as an etch mask, and a second alignment key having a boundary with a uniform interval from the boundary of the detection portion.

The second alignment key may be trenched or made in relief, and the first alignment key may include a display portion made in relief and representing the shape of the first alignment key.

The detection portion may be made of a plurality of islands, lines, or bars.

The gate insulating layer may include a first gate insulating layer having the same shape as the semiconductor, and a second gate insulating layer covering the first gate insulating layer.

An insulating layer may be deposited on the polysilicon layer, and then the insulating layer may be etched along with the polysilicon layer to form the first gate insulating layer.

The thin film transistor array panel may be a display panel for a liquid crystal display or an organic light emitting display.

A thin film transistor array panel is provided, which includes: an insulating substrate; a semiconductor layer including a source region, a drain region, and a channel region disposed between the source region and the drain region; a first gate insulating layer having the same shape as the semiconductor layer, and a second gate insulating layer covering the first gate insulating layer and the semiconductor layer; a gate electrode formed on the gate insulating layer of the channel region of the semiconductor layer; an interlayer insulating layer covering the gate electrode; a source electrode and a drain electrode respectively connected to the source and the drain regions; and a pixel electrode connected to the drain electrode.

The thin film transistor array panel may be a display panel for a liquid crystal display or an organic light emitting display.

BRIEF DESCRIPTION OF THE DRAWINGS

The present invention will become more apparent by describing embodiments thereof in detail with reference to the accompanying drawings, in which.

DETAILED DESCRIPTION OF EMBODIMENTS

Figure 1:
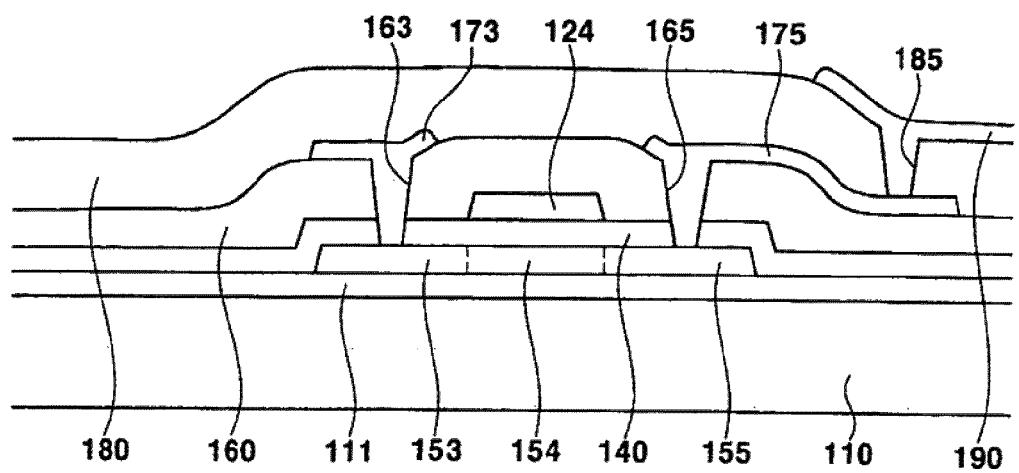
FIG. 1 is a sectional view of a TFT array panel according to an embodiment of the present invention.

The present invention will be described more fully hereinafter with reference to the accompanying drawings, in which preferred embodiments of the invention are shown. This invention may, however, be embodied in many different forms and should not be construed as being limited to the embodiments set forth herein. Like numerals refer to like elements throughout.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

The thin film transistor array panel according to embodiments of the present invention and a manufacturing method thereof will now be described with reference to the accompanying drawings.

FIG. 1 is a sectional view of the TFT array panel according to an embodiment of the present invention.

A blocking film 111 preferably made of silicon oxide ($SiO_2$) or silicon nitride (SiNx) is formed on an insulating substrate 110 made from transparent glass, quartz, or sapphire, as examples. The blocking film 111 may have a dual-layered structure.

A plurality of semiconductor layers 150 (see FIG. 2B) preferably made of polysilicon are formed on the blocking film 111. The semiconductor layers 150 include a plurality of extrinsic regions containing N-type or P-type conductive impurities, and at least one intrinsic region containing little of the conductive impurities.

The intrinsic regions of the semiconductor layers 150 include a channel region 154, and are doped with N-type impurities such as phosphorous (P) and arsenic (As), and include a plurality of heavily doped regions such as source and drain regions 153 and 155 separated from each other by the channel region 154. The extrinsic regions may include the lightly doped drain (LDD) regions respectively disposed between the source region 153 and the channel region 154, and the drain region 155 and the channel region 154.

A gate insulating layer 140 made of silicon nitride (SiNx) or silicon oxide ($SiO_2$) is formed on the semiconductor layer 150.

A plurality of gate electrodes connected to gate lines (not shown) is formed on the gate insulating layer 140.

The gate electrodes 124 transmit gate signals to thin film transistors and overlap the channel areas 154 of islands of the semiconductor layer 150.

The storage electrode may be added to form a storage capacitance of a pixel and may overlap the portion of the islands of the semiconductor layer 150.

An interlayer insulating layer 160 is formed on the gate insulating layer 140 and the gate electrodes 124. The interlayer insulating layer 160 along with the gate insulating layer 140 includes a first contact hole 163 and a second contact hole 165 through which the source region 153 and the drain region 155 are exposed, respectively.

A plurality of source electrodes 173 connected to data lines (not shown) intersecting the gate lines are formed on the interlayer insulating layer 160. When a pair of the data lines in parallel and a pair of the gate lines in parallel intersect, a pixel region is defined therein. The source electrodes 173 are connected with the source region 153 through the first contact hole 163.

A drain electrode 175 is formed on the same layer as a source electrode 173, at a predetermined distance therefrom. The drain electrode 175 is connected with the drain region 155 through the second contact hole 165.

A passivation layer 180 is formed on the interlayer insulating layer 160, the drain electrode 175, and the source electrode 173. The passivation layer 180 includes a third contact hole 185 through which the drain electrode 175 is exposed.

A pixel electrode 190 is formed on the passivation layer 180 and is connected with the drain electrode 175 through the third contact hole 185.

Hereinafter, a method of manufacturing the above-mentioned TFT array panel will be described with reference to FIG. 2A to 2G and 3A-4, along with the above-referenced FIG. 1.

Figure 2A:
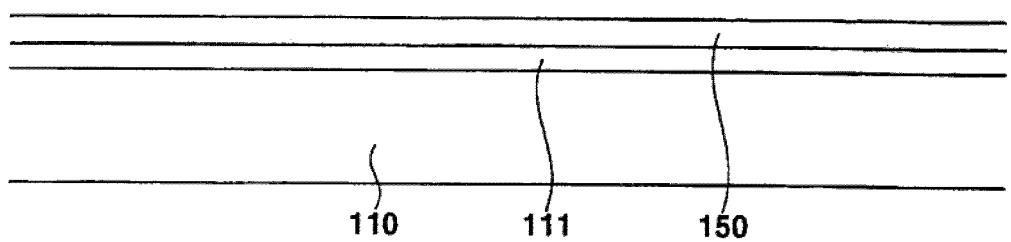
FIGS. 2A to 2G are sectional views showing intermediate steps to manufacture a TFT array panel according to an embodiment of the present invention.
Figure 2B:
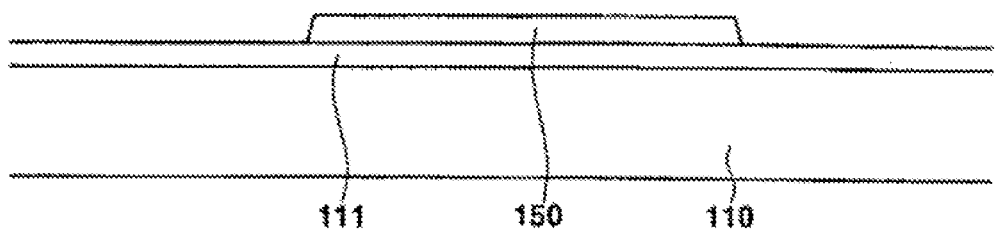
Figure 2C:
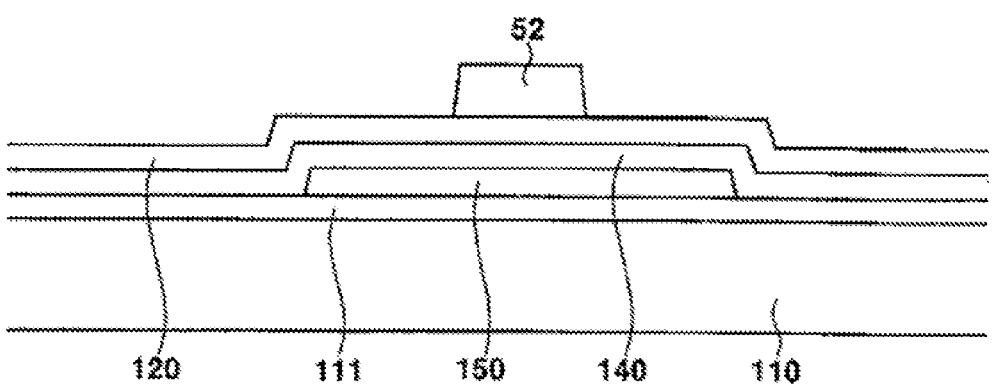
Figure 2D:
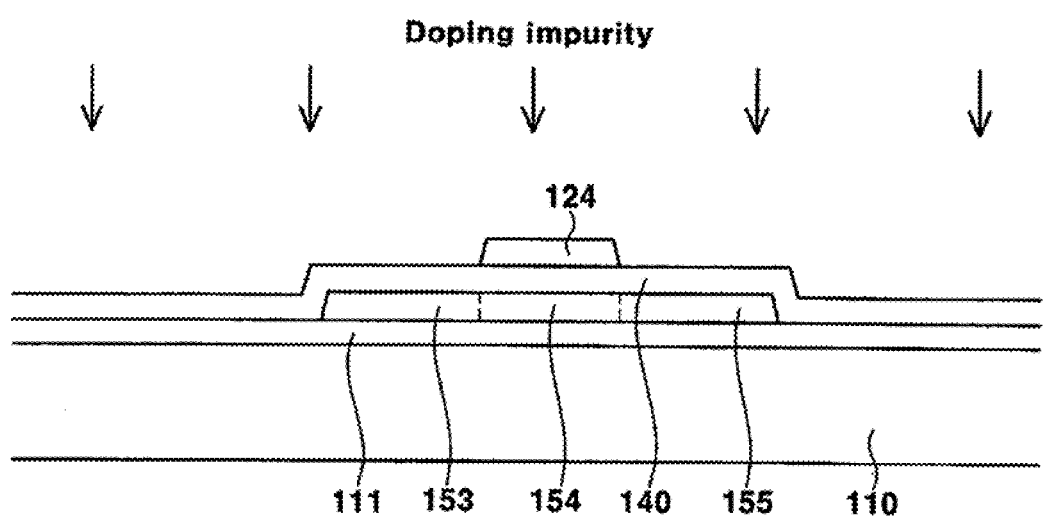
Figure 2E:
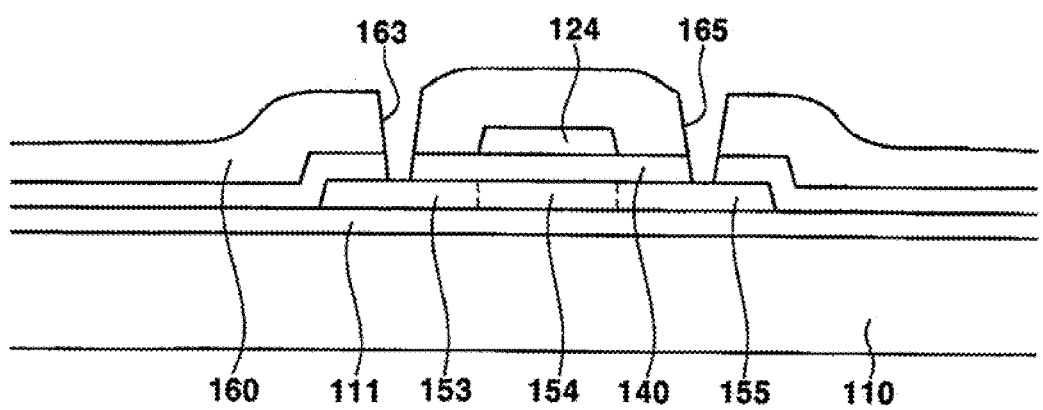
Figure 2F:
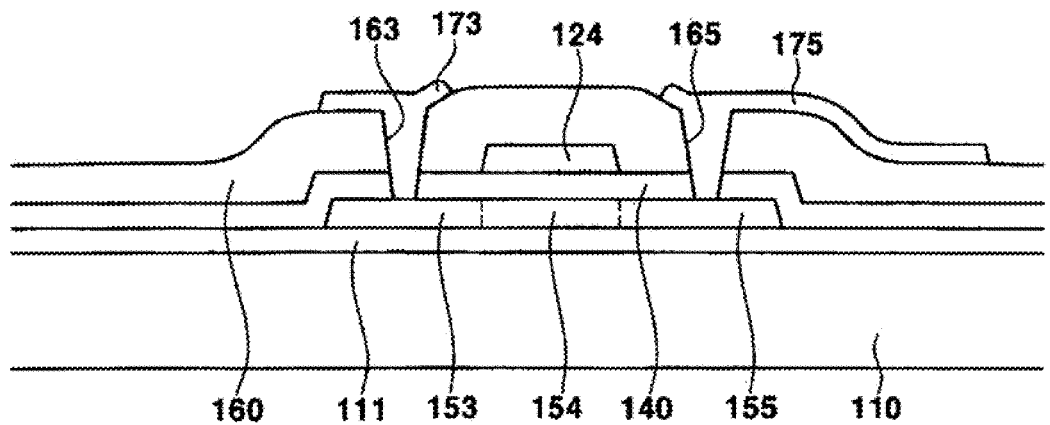
Figure 2G:
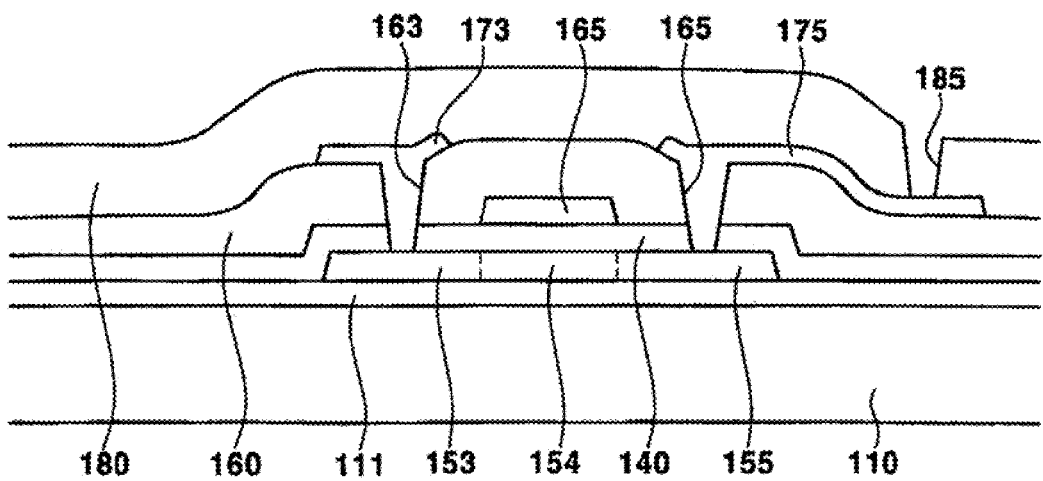
Figure 3A:
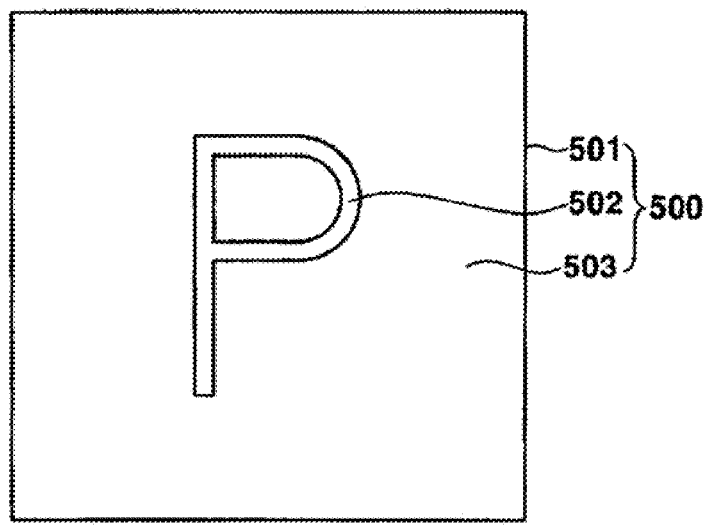
FIGS. 3A and 3B are layout views showing an alignment method using an alignment key for interlayer alignment of multi-layered thin films in the manufacturing method of the TFT array panel according to an embodiment of the present invention.
Figure 3B:
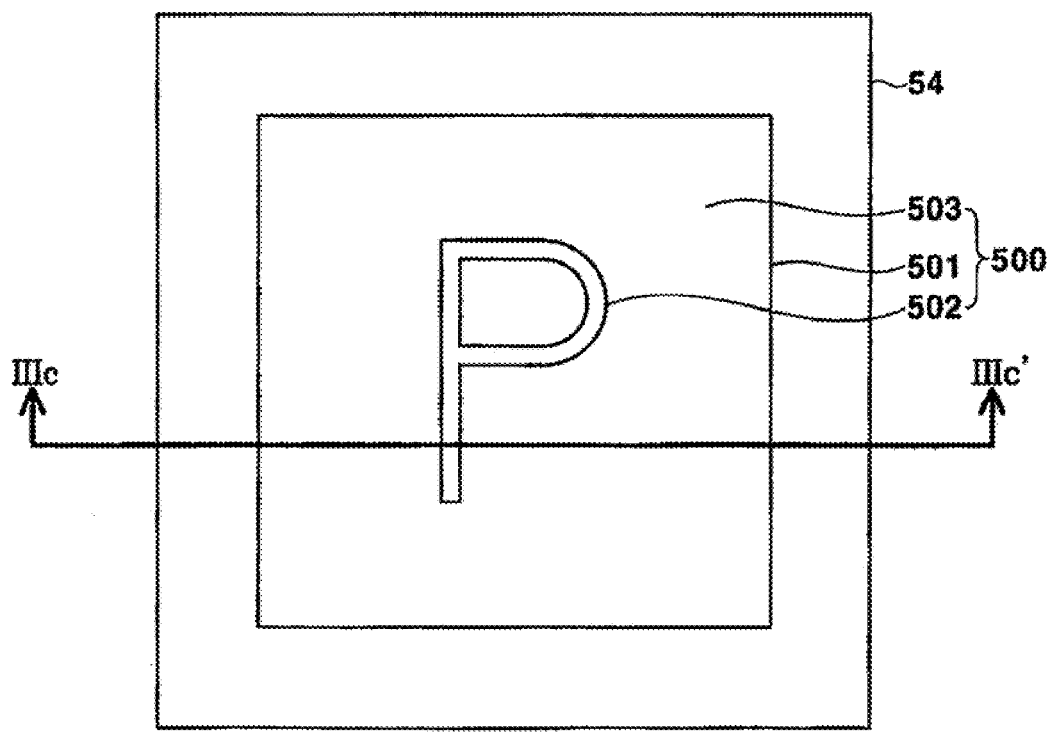
Figure 3C:
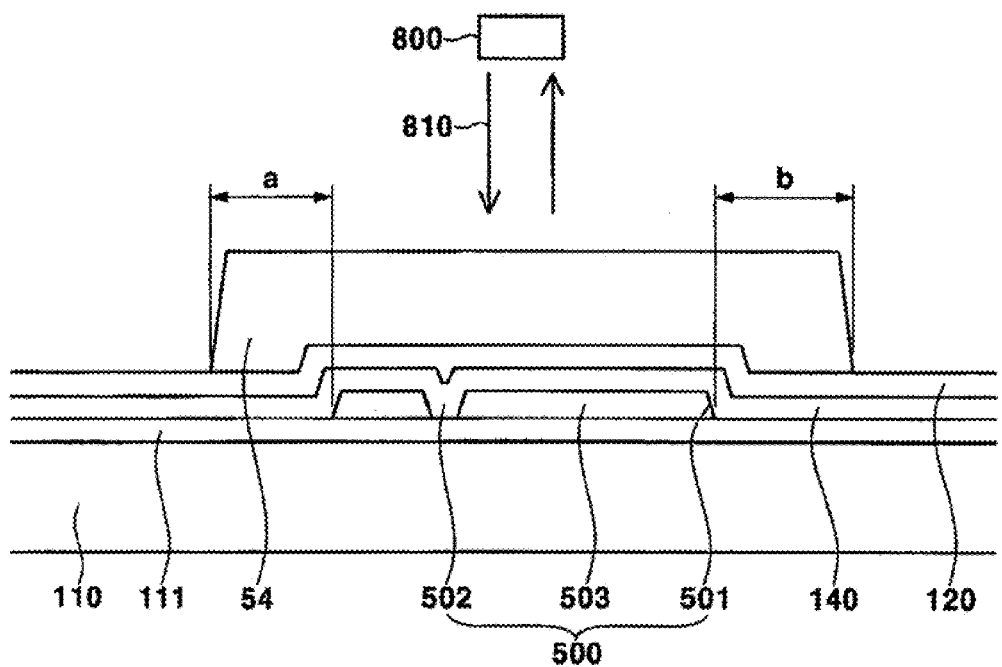
FIG. 3C is a cross-sectional view of the TFT array panel shown in FIG. 3B taken along the line IIIC-IIIC'.
Figure 4:
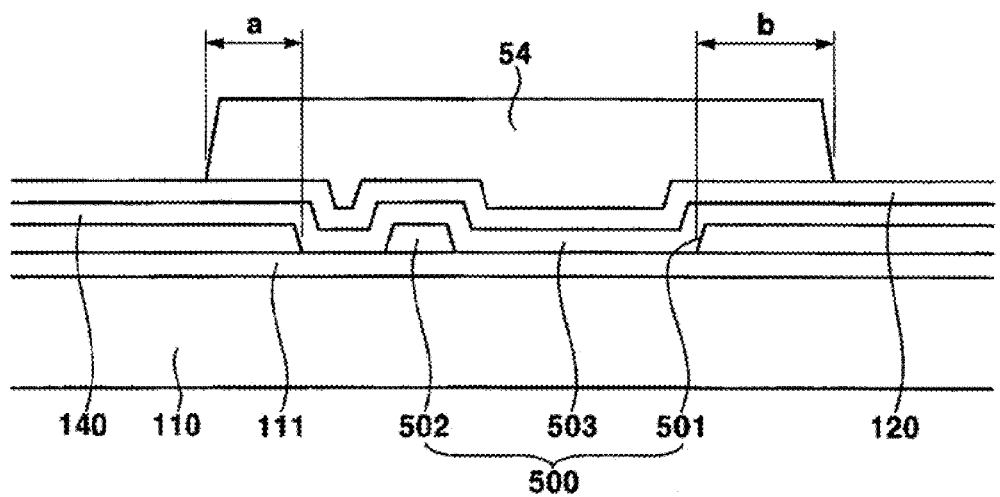
FIG. 4 is a sectional view showing an alignment key for interlayer alignment of multi-layered thin films in the manufacturing method according to another embodiment of the present invention.

FIGS. 2A to 2G are sectional views showing intermediate steps to manufacture a TFT array panel according to an embodiment of the present invention, FIGS. 3A and 3B are layout views showing an alignment method using an alignment key for interlayer alignment of multi-layered thin films in the manufacturing method of the TFT array panel according to an embodiment of the present invention, FIG. 3C is a cross-sectional view of the TFT array panel shown in FIG. 3B taken along the line IIIC-IIIC', and FIG. 4 is a sectional view showing an alignment key for interlayer alignment of multi-layered thin films in the manufacturing method according to another embodiment of the present invention.

As shown in FIG. 2A, a blocking layer 111 is formed on a transparent insulating substrate 110. The transparent insulating substrate 110 can be made of glass, quartz, sapphire, etc. Then, the surface is cleaned to remove impurities such as a natural oxide layer from the blocking layer 111.

An intrinsic amorphous silicon layer is formed to a thickness in a range of 500 Å to 1500 Å by chemical vapor deposition (CVD), etc.

Next, the amorphous silicon layer is crystallized by a sequential lateral solidification (SLS) process, an eximer laser annealing process, or a chamber annealing process to form a polycrystalline silicon semiconductor layer 150.

As shown in FIG. 2B, the polycrystalline silicon semiconductor layer 150 is patterned by photolithography using an optic mask to form islands of the semiconductor layer 150.

At this time, a first alignment key 500 which is at the same layer as the semiconductor layer 150 is formed on the edge region of the insulating substrate 110 to align interlayer layers in the manufacturing method according to the present invention, as shown in FIGS. 3A and 3C. The first alignment key 500 includes a display portion 502 which represents the shape of the first alignment key, such as a "P", and is made in intaglio, a circumferential portion 503 defining the outline and the display portion 502, and made in relief, and detection portion 501 defining the boundary of the circumferential portion 503 and made in intaglio.

Next, as shown in FIG. 2C, an insulating material such as SiNx, $SiO_2$, etc. is deposited on the semiconductor layer 150 by a CVD process to form a gate insulating layer 140.

Next, a gate conductive layer 120 of a double- or single-layered structure including a conductive material is deposited on the gate insulating layer 140. The conductive material is made of at least one of aluminum (Al), molybdenum (Mo), chromium (Cr), and an alloy thereof.

After forming the gate conductive layer 120, a photoresist is coated on the gate conductive layer 120, and the photoresist is exposed through a photo mask and developed to form a photoresist pattern 52.

A second alignment key 54 for aligning a gate electrode 124 hereafter is formed at the same layer as the photoresist pattern 52, as shown in FIGS. 3B and 3C. The second alignment key 54 is made as an embossed carving, and its four sides are parallel to the sides of the first alignment key 500.

The sides of the second alignment key 52 are located at the outside of the sides of the first alignment key 500, and completely cover the first alignment key 500.

Next, light 810 from an alignment detector 800 is irradiated on the first and second alignment keys 500 and 54 to detect interlayer alignment of the semiconductor layer 150 and the photoresist pattern 52. Here, the intervals a and b between the detection portion 501 of the first alignment key 500 and the second alignment key 54 are measured to detect whether the photo mask for the photoresist pattern 52 is correctly aligned and whether the photoresist pattern 52 is formed at the correct location. In the embodiment according to the present invention, because the second alignment key 54 completely covers the first alignment key 500, the alignment detector 800 only detects waves due to the steps of both the first and the second alignment keys 54 and 500 when the alignment detector 800 passes the first and the second alignment keys 54 and 500 when the surface of the first alignment key 500 is protruded. Accordingly, detection noise due to the protrusion of the first alignment key 500 is not generated when the intervals a and b between the first alignment key 500 and the second alignment key 54 are measured and found to be within appropriate limits, thereby minimizing the interlayer misalignment by preventing the detection noise due to the protrusion.

On the other hand, in another embodiment according to the present invention, detection and display portions 501 and 502 of the first alignment key 500 may be made in intaglio, and a circumferential portion 503 of the first alignment key 500 may be made in relief, as shown in FIG. 4.

Next, if misalignment is found when the intervals a and b between the first alignment key 500 and the second alignment key 54 are measured, the photoresist pattern 52 is formed again, and if the alignment between the first alignment key 500 and the second alignment key 54 are accurate, the next step is executed.

The gate conductive layer 120 may have a multi-layered structure including two films having different physical characteristics. One of the two films is preferably made of a low resistivity metal including an Al-containing metal for reducing signal delay, such as an Al—Nd alloy. The other film is preferably made of a material such as Cr, Mo, and a Mo alloy, which have good physical, chemical, and electrical contact characteristics with other materials such as indium tin oxide (ITO) and indium zinc oxide (IZO).

The gate conductive layer 120 is then etched by using the photoresist pattern 52 as a photo mask to form a gate electrode 124 connected to a gate line (not shown), as shown in FIG. 2D. The lateral sides of the gate electrode 124 are inclined relative to a surface of the substrate 110 so that the gate electrode 124 can later be adhered more tightly with an overlying layer to reinforce adhesion of an upper layer.

Then, the semiconductor layer 150 is heavily doped with conductive impurities using the gate electrode 124 or the photoresist pattern 52 as a doping mask to form a source region 153 and a drain region 155, and to define a channel region 154. Subsequently, the semiconductor layer 150 may be lightly doped with conductive impurities by using a scanning device or a beam device, thereby completing the semiconductor layer 150 having the LDD.

Next, as shown in FIG. 2E, an interlayer insulating layer 160 made of an insulating material is formed on the entire substrate 110, and then etched along with the gate insulating layer 140 to form a first contact hole 163 and a second contact hole 165 such that the source region 153 and the drain region 155 are respectively exposed.

Next, as shown in FIG. 2F, a data conductive layer made of molybdenum (M), aluminum (Al), or an alloy thereof is deposited on the interlayer insulating layer 160 as a single layer or multiple layers. The data conductive layer is then patterned by a photo etching process to form a source electrode 173 which is connected with the source region 153 through the contact hole 163 and to a data line (not shown), and a drain electrode 175 which is connected with the drain region 155 through the contact hole 165.

The source and drain electrodes 173 and 175 are made in a single-layered structure of a conductive material containing Al or Mo, or in a double-layered structure including Cr or Mo along with the single layer structure.

The source electrode 173 and the drain electrode 175 have tapered lateral sides, so the data line 171 and the drain electrode 175 can be adhered more tightly with the overlying layer.

As shown in FIG. 2G, a passivation layer 180 is formed to cover the source electrode 173 and the drain electrode 175. Then, the passivation layer 180 is patterned by a photo etching process to form a third contact hole 185 through which the drain electrode 175 is exposed. The passivation layer 180 can be made of an organic material having prominent planarization properties and photosensitivity, an insulating material having a low dielectric constant such as a-Si:C:O and a-Si:O:F, which is formed by plasma enhanced chemical vapor deposition (PECVD), or an inorganic material such as SiNx, etc.

Next, as shown in FIG. 1, a transparent conductive material such as indium zinc oxide (IZO), indium tin oxide (ITO), etc., is deposited on the passivation layer 180. The transparent conductive layer is then patterned to form a pixel electrode 190 which is connected with the drain electrode 175 through the third contact hole 185.

The alignment method using the first and the second alignment key may be used to form other thin films besides the semiconductor layer 150.

Figure 5:
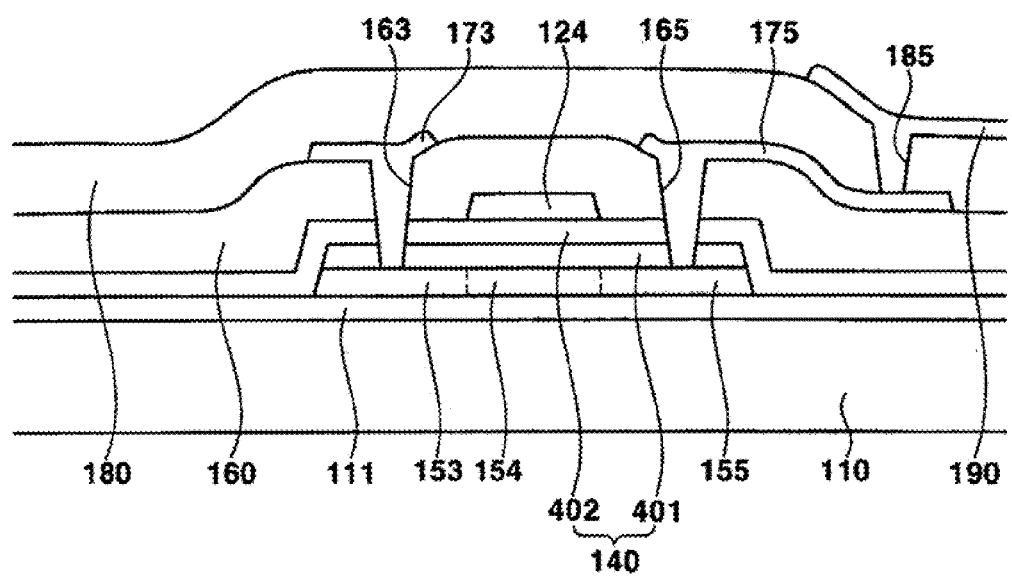
FIG. 5 is a sectional view of the TFT array panel according to another embodiment of the present invention.

FIG. 5 is a sectional view of the TFT array panel according to another embodiment of the present invention.

As shown in FIG. 5, layered structures of the panels according to this embodiment are almost the same as that shown in FIG. 1.

However, a gate insulating layer 140 covering a semiconductor layer 150 includes a first gate insulating layer 401 having the same shape as the semiconductor layer 150 and being made of silicon oxide or silicon nitride, and a second gate insulating layer 402 covering the semiconductor layer 150 and the first gate insulating layer 401.

Figure 7A:
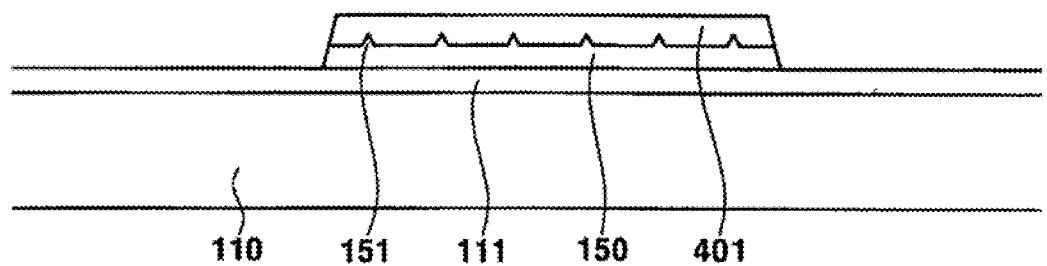
FIGS. 7a and 7B are sectional views showing a portion of intermediate steps to manufacture a TFT array panel according to another embodiment of the present invention.
Figure 7B:
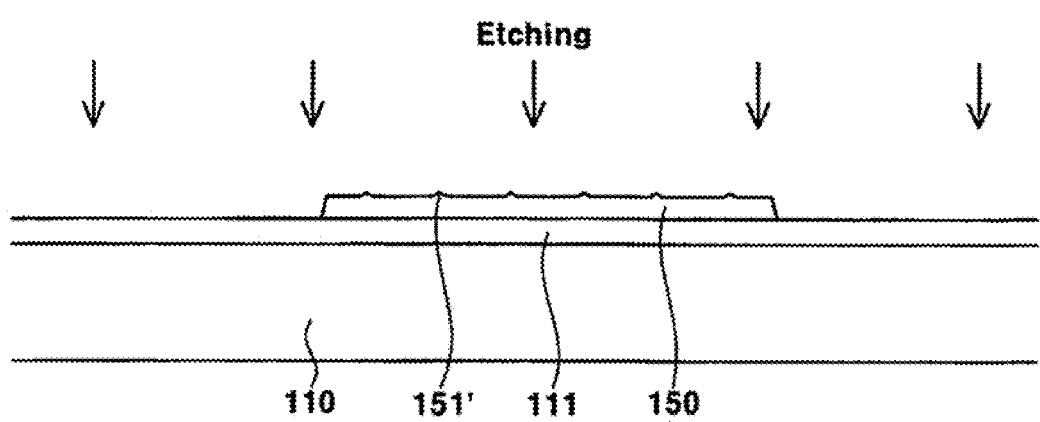
Figure 8A:
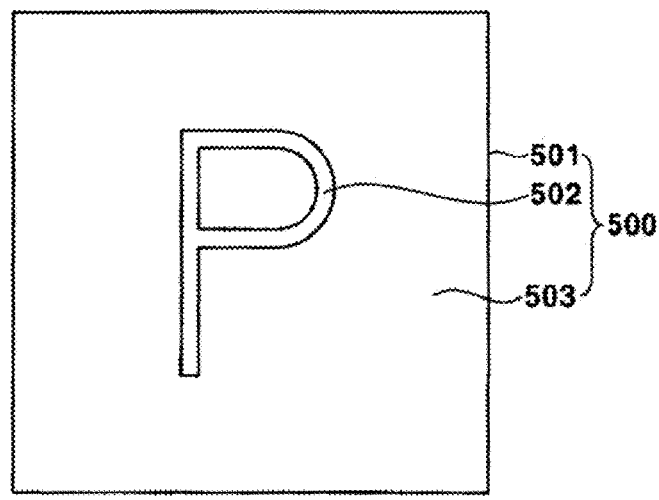
FIGS. 8A and 8B are layout views showing an alignment method using an alignment key for interlayer alignment of multi-layered thin films in the manufacturing method of the TFT array panel according to an embodiment of the present invention.
Figure 8B:
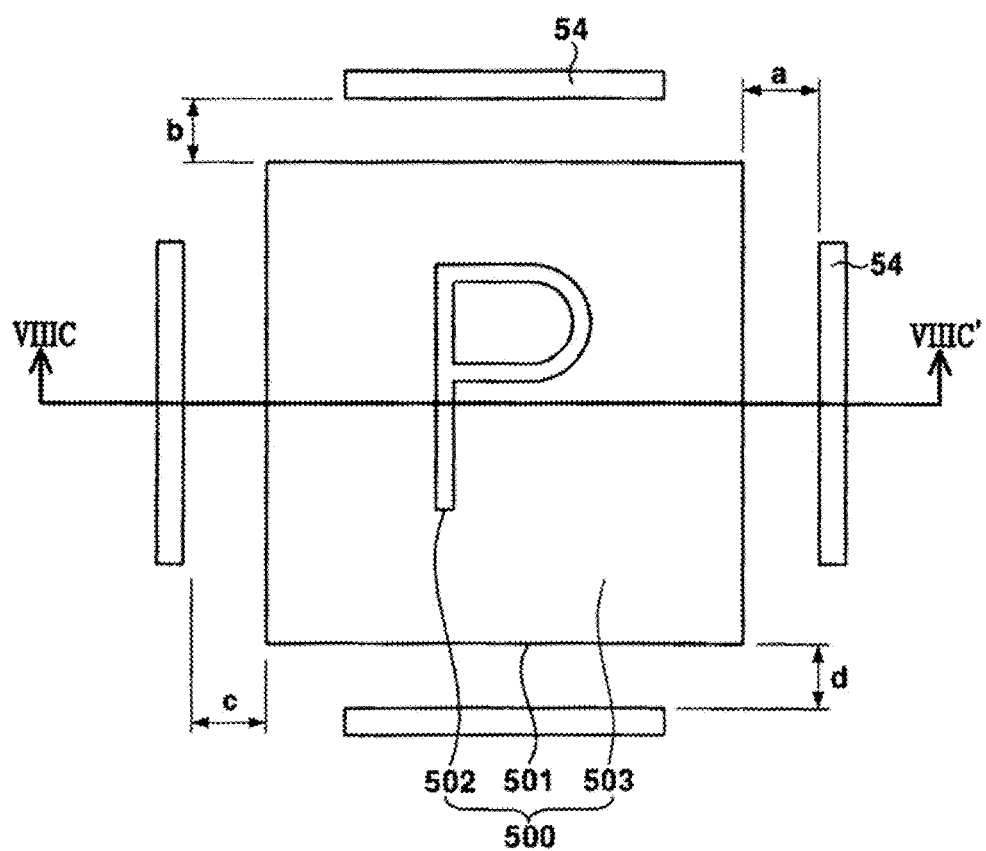
Figure 8C:
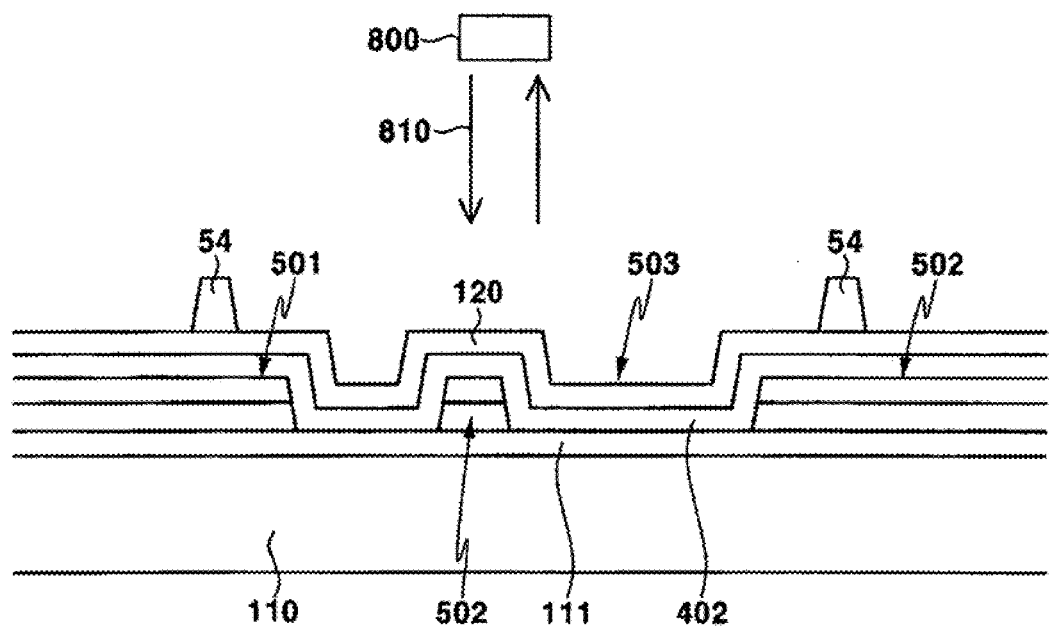
FIG. 8C is a cross-sectional view of the TFT array panel shown in FIG. 8B taken along the line VIIIC-VIIIC'.
Figure 9A:
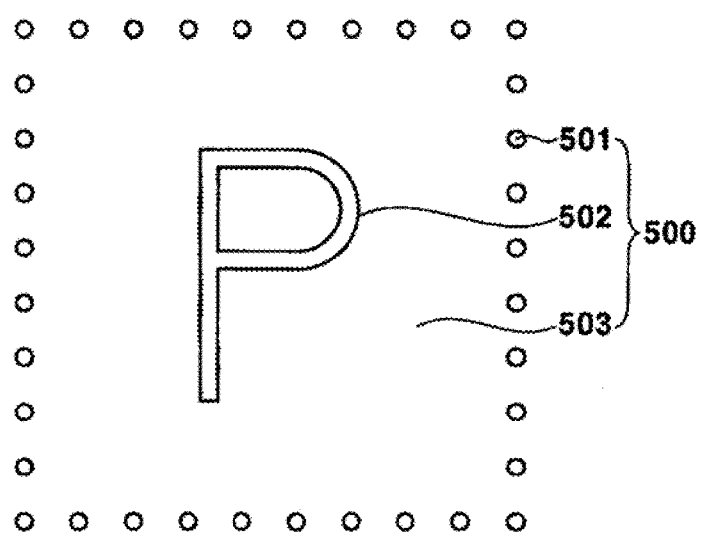
FIGS. 9A to 9B are sectional views respectively showing an alignment key for interlayer alignment of multi-layered thin films in the manufacturing method according to another embodiment of the present invention.
Figure 9B:
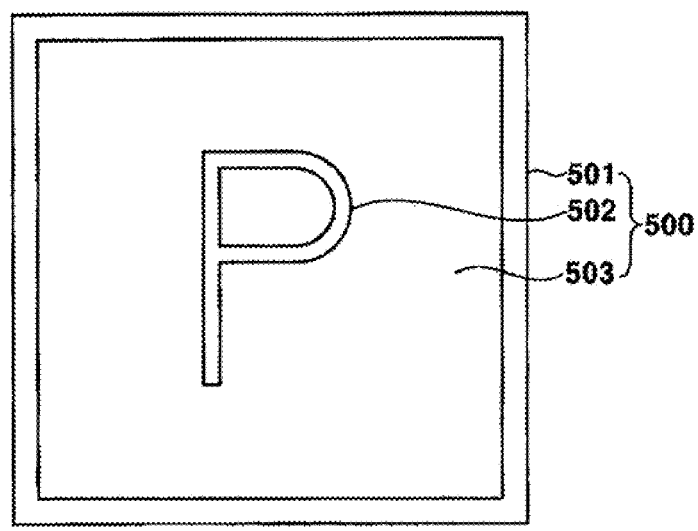
Figure 10A:
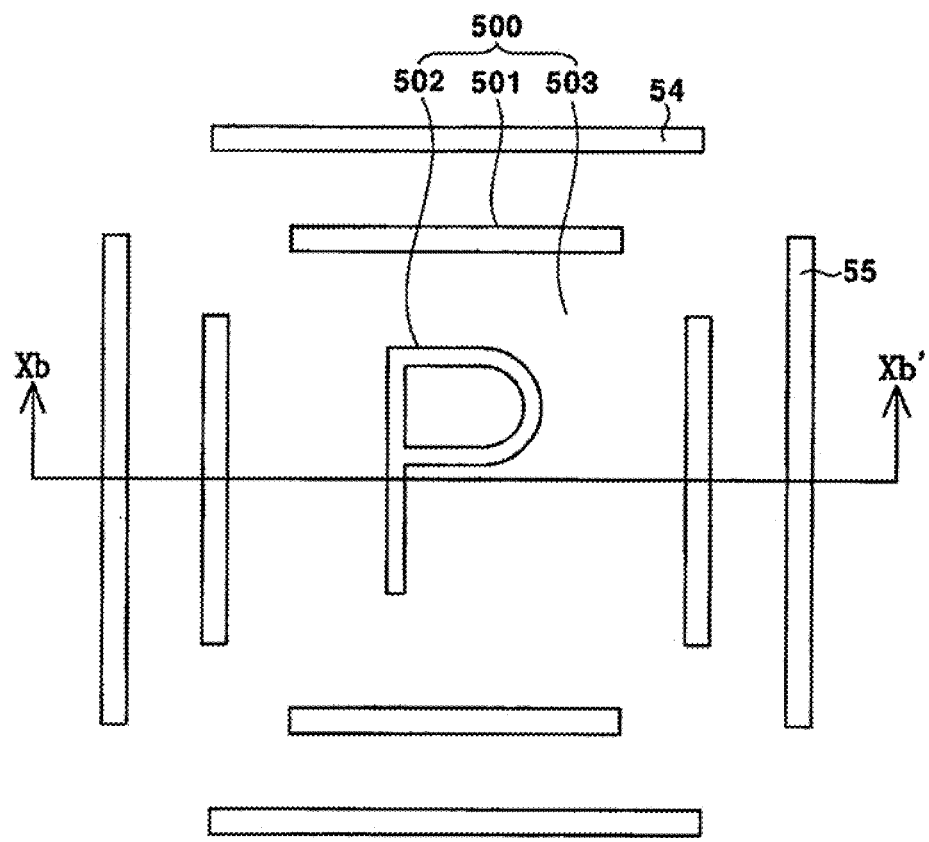
FIG. 10A is a layout view showing an alignment method using an alignment key for interlayer alignment of multi-layered thin films in the manufacturing method of the TFT array panel according to an embodiment of the present invention.
Figure 10B:
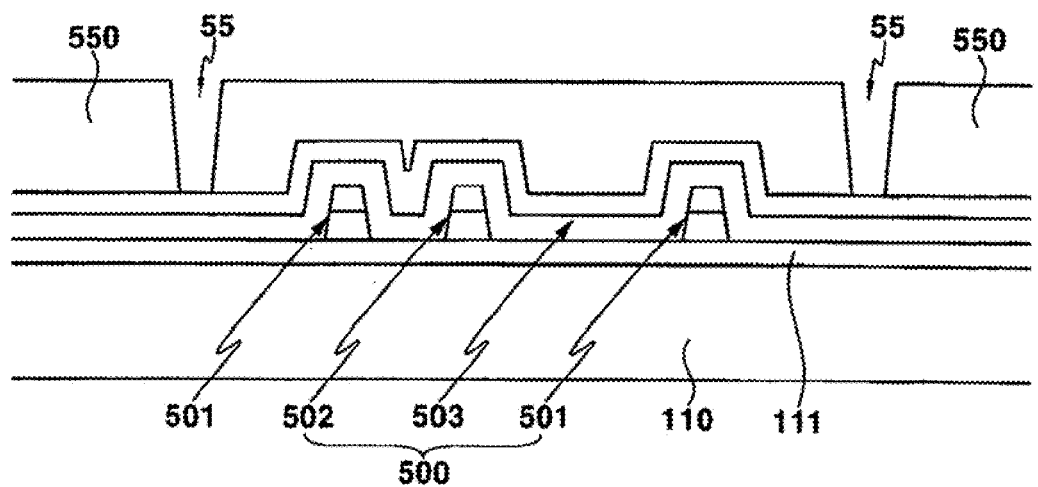
FIG. 10B is a cross-sectional view of the TFT array panel shown in FIG. 10A taken along the line XB-XB'.

FIGS. 6A to 6G are sectional views showing intermediate steps to manufacture a TFT array panel according to another embodiment of the present invention; FIGS. 7a and 7B are sectional views showing a portion of intermediate steps to manufacture a TFT array panel according to another embodiment of the present invention; FIGS. 8A and 8B are layout views showing an alignment method using an alignment key for interlayer alignment of multi-layered thin films in the manufacturing method of the TFT array panel according to an embodiment of the present invention; FIG. 8C is a cross-sectional view of the TFT array panel shown in FIG. 8B taken along the line VIIIC-VIIIC'; FIGS. 9A to 9B are sectional views respectively showing an alignment key for interlayer alignment of multi-layered thin films in the manufacturing method according to another embodiment of the present invention; FIG. 10A is a layout view showing an alignment method using an alignment key for interlayer alignment of multi-layered thin films in the manufacturing method of the TFT array panel according to an embodiment of the present invention; and FIG. 10B is a cross-sectional view of the TFT array panel shown in FIG. 10A taken along the line XB-XB'.

Figure 6A:
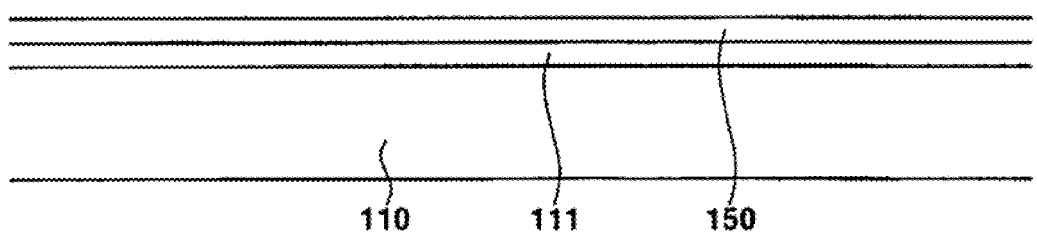
FIGS. 6A to 6G are sectional views showing intermediate steps to manufacture a TFT array panel according to another embodiment of the present invention.

As shown in FIG. 6A, a blocking layer 111 is formed on a transparent insulating substrate 110. The transparent insulating substrate 110 can be made of glass, quartz, sapphire, etc. Then, the surface is cleaned to remove impurities such as a natural oxide layer from the blocking layer 111. An intrinsic amorphous silicon layer is formed and crystallized by a sequential lateral solidification (SLS) process, an eximer laser anneal process, or a chamber anneal process to form a polycrystalline silicon layer 150.

Figure 6B:
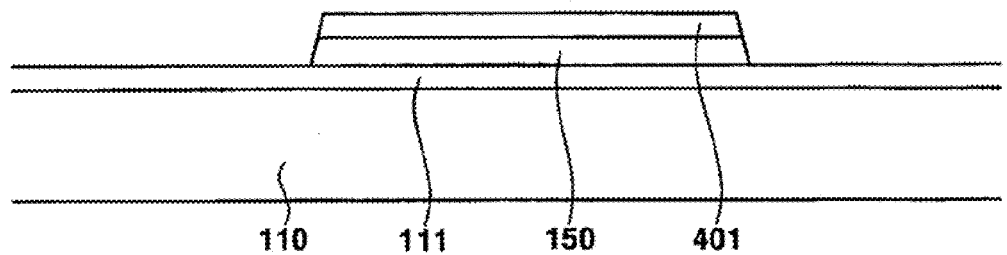

Next, as shown in FIG. 6B, a first insulating layer made of silicon oxide or silicon nitride is deposited on the polysilicon layer 150, and patterned along with the polysilicon layer 150 by a photolithography process to form a semiconductor layer 150 and a first gate insulating layer 401. In the manufacturing method according to this embodiment, because the semiconductor layer 150 is etched after covering the semiconductor layer 150 with the first gate insulating layer 401, the surface of the semiconductor layer 150 is not exposed to the conditions of photolithography process. Accordingly, the first gate insulating layer 401 prevents the surface of the semiconductor layer 150 from contamination by the photoresist in the photolithography process, and the qualities of the thin film transistor are enhanced and uniform, thereby increasing the characteristics of the display device.

On the other hand, in a manufacturing method according to another embodiment, a first insulating layer made of silicon oxide or silicon nitride is deposited on the polysilicon layer 150, and patterned along with the polysilicon layer 150 by a photolithography process to form a semiconductor layer 150 and a first gate insulating layer 401, as shown in FIG. 7A. Then, the first gate insulating layer 401 may be removed, as shown in FIG. 7B. In the manufacturing method of the thin film transistor array panel, the grains grow until the grains meet each other in the SLS process when the polysilicon layer 150 (referring to FIG. 6A) is crystallized, and the protrusions 151 (referring to 7A) are formed at the positions where the grains meet. Consequently, because the protrusions 151 have the large step, the step of the protrusions may cause detection noise while detecting the step of the alignment key in the manufacturing process, and prevent the detection of the alignment key, thereby generating interlayer misalignment. To solve this problem, the first gate insulating layer 401 is removed as in the above description in this embodiment of the present invention. Then, the portion of the protrusion 151 is etched when the first gate insulating layer 401 is removed as shown in FIG. 7B, so the steps of the protrusions 151' of the semiconductor layer 150 become low. Accordingly, the detection noise due to the protrusion 151' may be minimized while detecting the steps of the alignment keys for interlayer alignment, thereby preventing the interlayer misalignment.

At this time, a first alignment key 500 which is at the same layer as the semiconductor layer 150 and the first gate insulating layer 401 is formed on the edge region of the insulating substrate 110 to align interlayer layers in the manufacturing method according to the present invention, as shown in FIGS. 8A and 8C. The first alignment key 500 includes a detection portion 501 defining the boundary of the first alignment key 500 and made as an embossed carving, a display portion 502 which represents the shape of the first alignment key such as a "P" and made as an embossed carving, and a circumferential portion 503 made in intaglio to define the boundary of the detection portion 501 and being located between the display portion 502 and the detection portion 501.

Figure 6C:
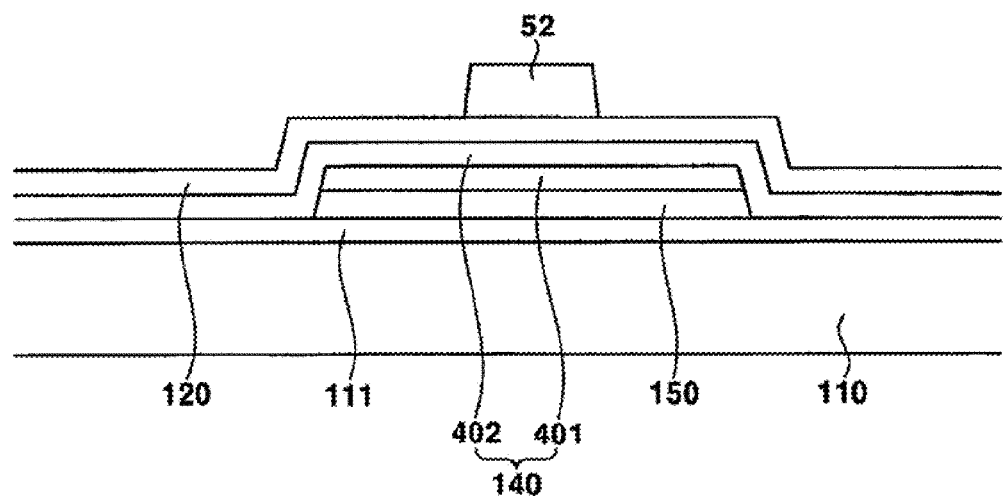

Next, as shown in FIG. 6C, a second insulating layer 402 such as SiNx, SiO$_2$, etc. is deposited on the semiconductor layer 150 by a CVD process to form a gate insulating layer 140.

Next, a gate conductive layer 120 of a double- or single-layered structure including a conductive material is deposited on the gate insulating layer 140. The conductive material is made of at least one of aluminum (Al), molybdenum (Mo), chromium (Cr), and an alloy thereof.

After forming the gate conductive layer 120, a photoresist is coated on the gate conductive layer 120, and the photoresist is exposed through a photo mask and developed to form a photoresist pattern 52.

The gate conductive layer 120 may have a multi-layered structure including two films having different physical characteristics. One of the two films is preferably made of a low resistivity metal including an Al-containing metal for reducing signal delay, such as an Al—Nd alloy. The other film is preferably made of a material such as Cr, Mo, and a Mo alloy such as a MoW alloy, which have good physical, chemical, and electrical contact characteristics with other materials such as indium tin oxide (ITO) and indium zinc oxide (IZO).

At this time, a second alignment key 54 for aligning a gate electrode 124 hereafter is formed at the same layer as the photoresist pattern 52 as shown in FIGS. 8B and 8C. The second alignment key 52 is made as an embossed carving, and has four bars parallel to the sides of the first alignment key 500. The boundary defining the bar of the second alignment key 54 is parallel to the detection portion 501 of the first alignment key 500.

Next, the light 801 from an alignment detector 800 is irradiated on the first and second alignment keys 500 and 54 to detect interlayer alignment of the semiconductor layer 150 and the photoresist pattern 52. Here, the intervals a, b, c, and d between the detection portion 501 of the first alignment key 500 and the second alignment key 54 are measured to detect whether the photo mask for the photoresist pattern 52 is correctly aligned and whether the photoresist pattern 52 is formed at the correct location. In the current embodiment according to the present invention, because the circumferential portion 503 of the first alignment key 500 is made in intaglio, the detection noise due to protrusion of the first alignment key 500 is not generated when the interval between the first alignment key 500 and the second alignment key 54 are determined to be appropriate, thereby minimizing the interlayer misalignment by preventing the detection noise due to the protrusion.

On the other hand, a detection portion 501 of the first alignment key 500 may be made of a plurality of islands which are arranged in a line as shown in FIG. 9A, and the detection portion 501 may alternatively be a quadrangle in a line, as shown in FIG. 9B, in another embodiment according to the present invention.

Furthermore, a detection portion 501 of the first alignment key 500 may be made as a plurality of bars as shown in FIGS. 10A and 10B, and a second alignment key 55 may be made as a trench of a photoresist pattern 550 in another embodiment according to the present invention.

Figure 6D:
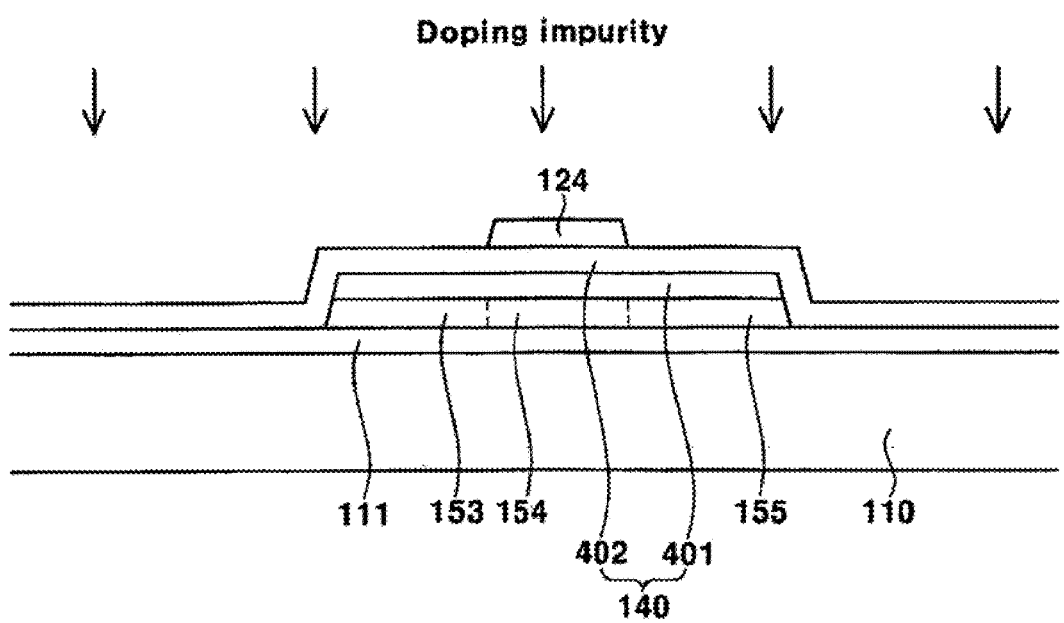

Next, as shown in FIG. 6D, the gate conductive layer 120 is etched by using the photoresist pattern 52 as a photo mask to form a gate line (not shown) including a gate electrode 124.

At this time, the lateral sides of the gate electrode 124 are inclined relative to a surface of the substrate 110 so that the gate electrode 124 can be adhered more tightly to the overlying layer to later reinforce the adhesion of an upper layer.

Then, the semiconductor layer 150 is heavily doped with conductive impurities using the gate electrode 124 or the photoresist pattern 52 as a doping mask to form a source region 153 and a drain region 155, and to define a channel region 154. Subsequently, the semiconductor layer 150 may be lightly doped with conductive impurities by using a scanning device or a beam device, thereby completing the semiconductor layer 150 having the LDD.

Figure 6E:
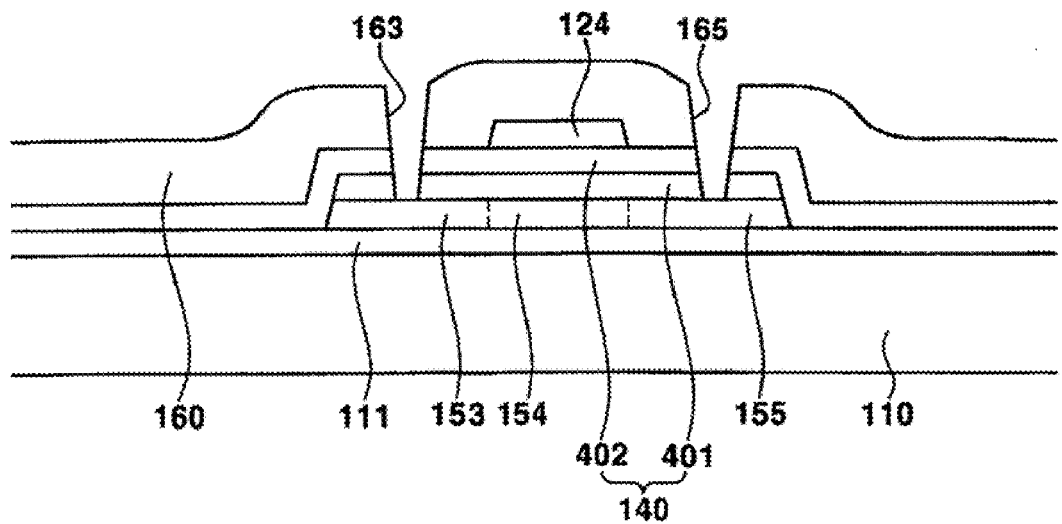

Next, as shown in FIG. 6E, an interlayer insulating layer 160 made of an insulating material is formed on the entire substrate 110, and then etched along with the gate insulating layer 140 to form a first contact hole 163 and a second contact hole 165 where the source region 153 and the drain region 155 are respectively exposed.

Figure 6F:
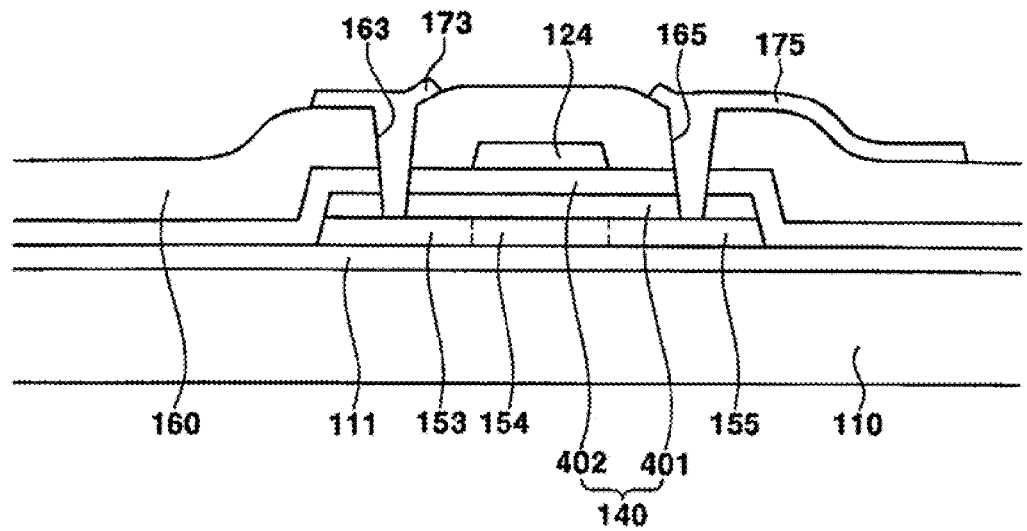

Next, as shown in FIG. 6F, a data conductive layer of a single-layered structure or multi-layered structure made of molybdenum (M), aluminum (Al), or an alloy thereof is deposited on the interlayer insulating layer 160. The data conductive layer is then patterned by a photo etching process to form a source electrode 173 which is connected to the source region 153 through the contact hole 163 and is connected to a data line (not shown), and a drain electrode 175 which is connected with the drain region 155 through the contact hole 165.

The source and the drain electrodes 173 and 175 are made in a single-layered structure of a conductive material containing Al or Mo, or a double-layered structure including Cr or Mo along with the single-layered structure.

The source electrode 173 and the drain electrode 175 have tapered lateral sides, so that the data line 171 and the drain electrode 175 can be adhered more tightly with the overlying layer.

Figure 6G:
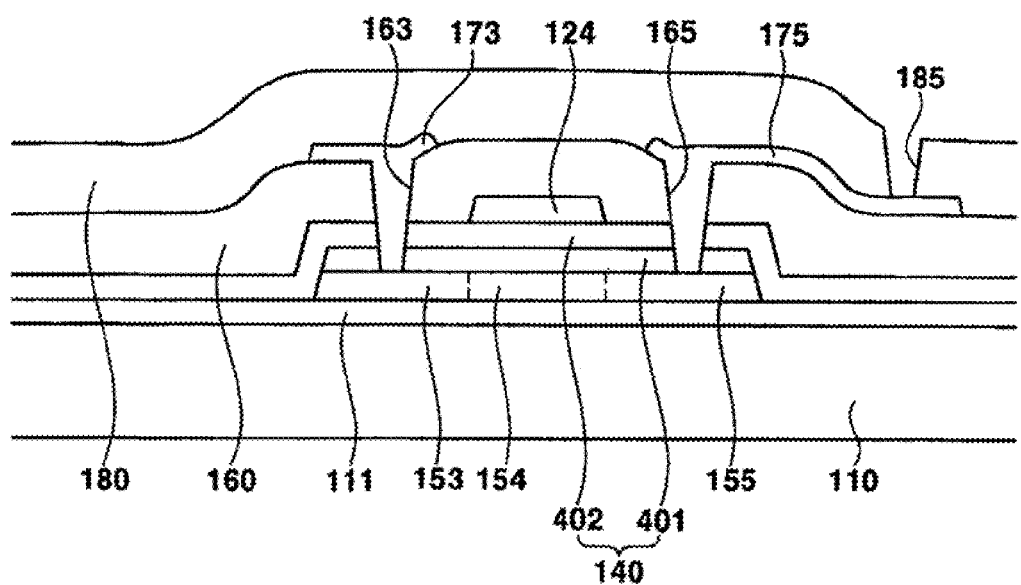

As shown in FIG. 6G, a passivation layer 180 is formed to cover the source electrode 173 and the drain electrode 175. Then, the passivation layer 180 is patterned by a photo etching process to form a third contact hole 185 through which the drain electrode 175 is exposed. The passivation layer 180 can be made of an organic material having prominent planarization properties and photosensitivity, an insulating material having a low dielectric constant such as a-Si:C:O and a-Si:O:F, which are formed by plasma enhanced chemical vapor deposition (PECVD), or an inorganic material such as SiNx, etc.

Next, as shown in FIG. 5, a transparent conductive material such as indium zinc oxide (IZO), indium tin oxide (ITO), etc., is deposited on the passivation layer 180. The transparent conductive layer is then patterned to form a pixel electrode 190 which is connected with the drain electrode 175 through the third contact hole 185.

The alignment method using the first and the second alignment keys may be used to form other thin films besides the semiconductor layer 150.

The above descriptions may be adapted to a manufacturing method of other flat panel displays for OLEDs.

Now, a TFT array panel for an OLED according to an embodiment of the present invention will be described in detail with reference to FIGS. 11-13.

Figure 11:
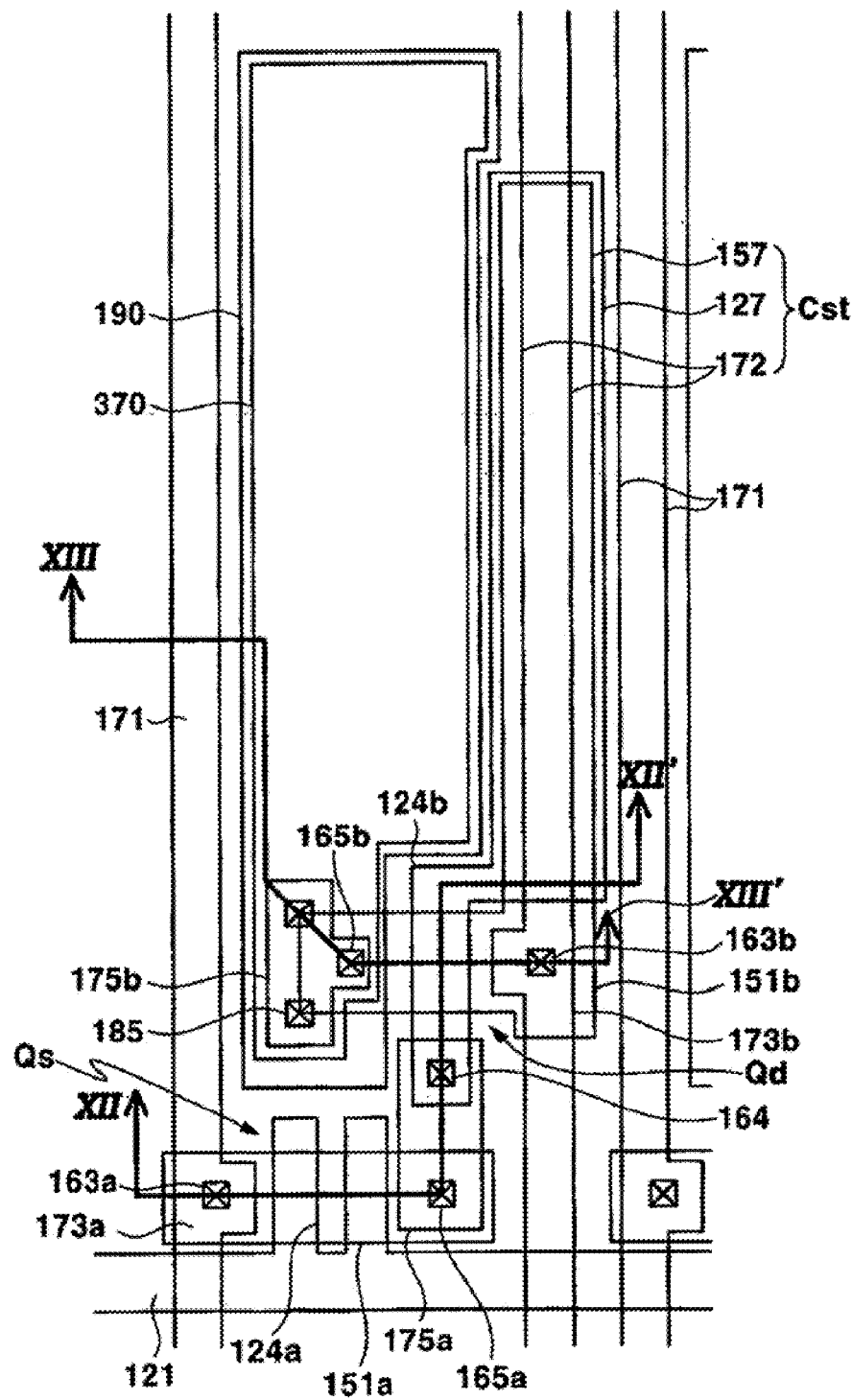
FIG. 11 is a schematic plan view of a display panel for an OLED according to an embodiment of the present invention.
Figure 12:
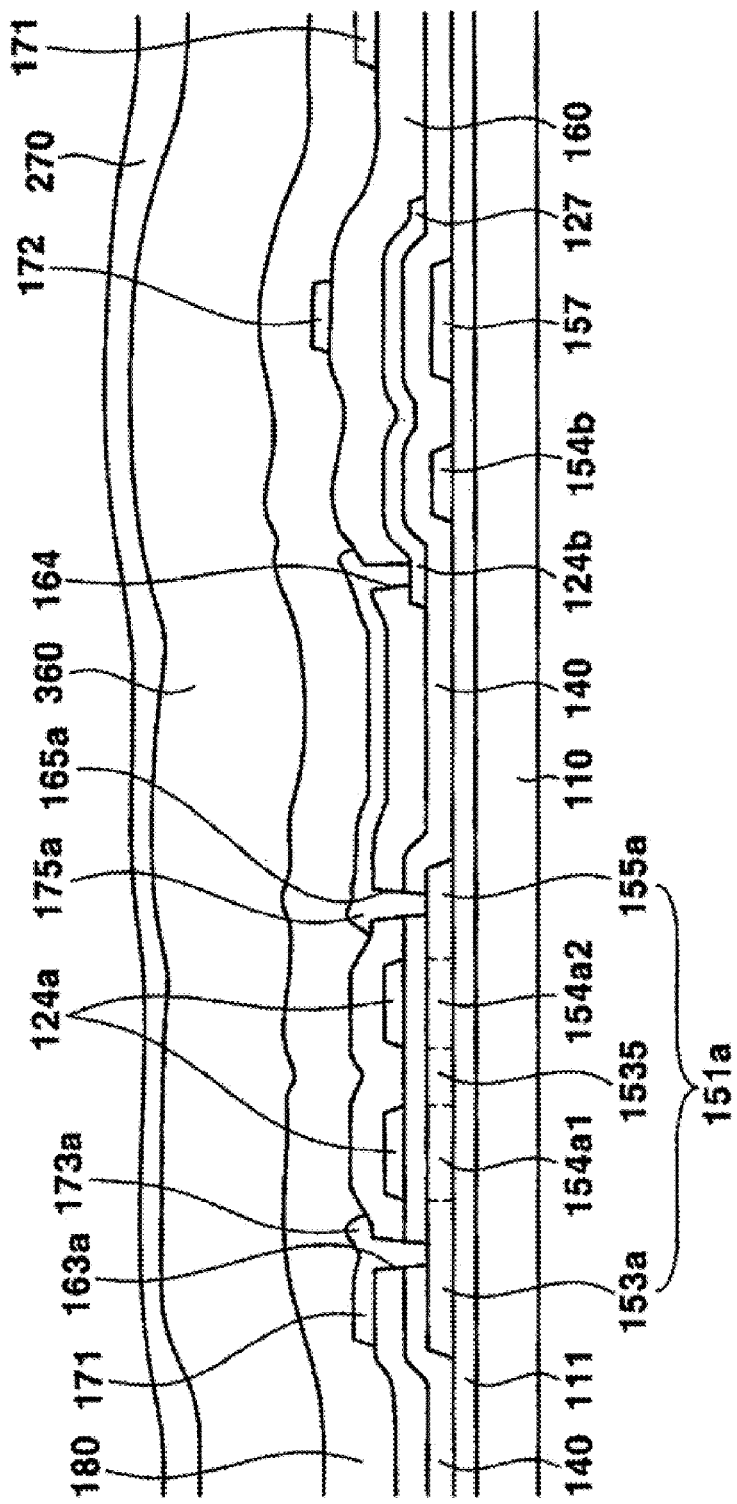
FIG. 12 is a sectional view of the display panel shown in FIG. 11 taken along the line XII-XII'.
Figure 13:
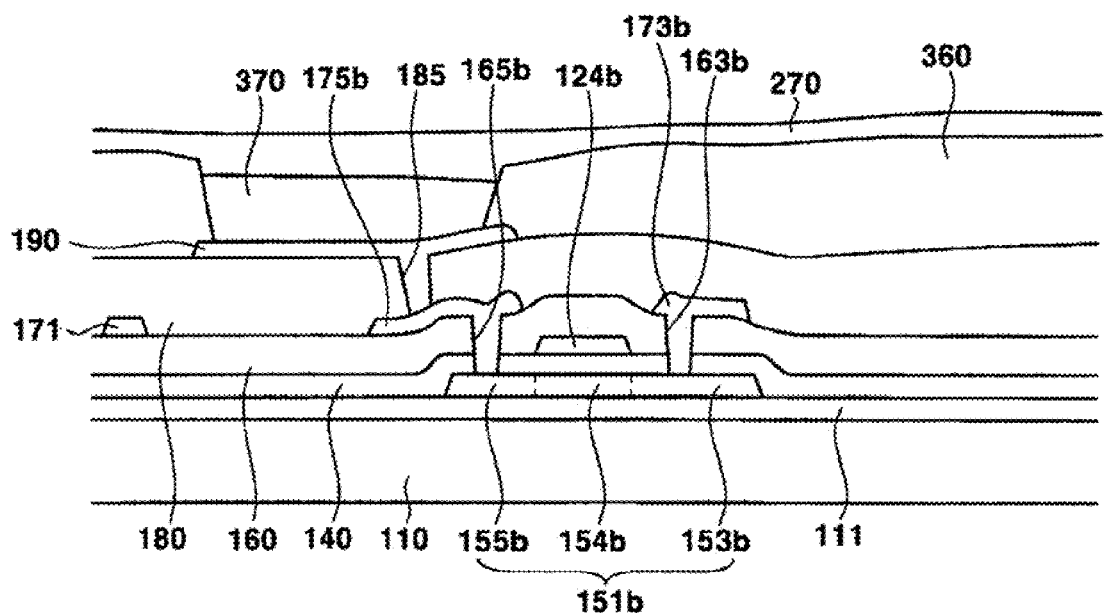
FIG. 13 is a sectional view of the display panel shown in FIG. 11 taken along the line XIII-XIII'.

FIG. 11 is a schematic plan view of a TFT array panel for an OLED according to an embodiment of the present invention, FIG. 12 is a sectional view of the TFT array panel shown in FIG. 11 taken along the line XII-XII', and FIG. 13 is a sectional view of the TFT array panel shown in FIG. 11 taken along the line XIII-XIII'.

A blocking layer 111 preferably made of silicon oxide or silicon nitride is formed on an insulating substrate 110 preferably made of transparent glass. The blocking film 111 may have a dual-layered structure.

A plurality of semiconductor islands 151a and 151b preferably made of polysilicon are formed on the blocking film 111. Each of the semiconductor islands 151a and 151b includes a plurality of extrinsic regions containing N-type or P-type conductive impurities and at least one intrinsic region containing little of the conductive impurities.

Regarding a semiconductor island 151a for a switching TFT Qa, the extrinsic regions include a first source region 153a, an intermediate region 1535, and a first drain region 155a, which are doped with N-type impurities and separated from one another, and the intrinsic regions include a pair of (first) channel regions 154a1 and 154a2 disposed between the extrinsic regions 153a, 1535, and 155a.

Concerning a semiconductor island 151b for a driving TFT Qb, the extrinsic regions include a second source region 153b and a second drain region 155b, which are doped with P-type impurities and separated from one another, and the intrinsic region includes a channel region 154b disposed between the second source region 153b and the second drain region 155b. The second source region 153b extends to form a storage region 157.

The extrinsic regions may further include lightly doped regions (not shown) disposed between the channel regions 154a1, 154a2, and 154b and the source and the drain regions 153a, 155a, 153b, and 155b. The lightly doped regions may be substituted with offset regions that contain substantially no impurities.

Alternatively, the extrinsic regions 153a and 155a of the first semiconductor islands 151a are doped with P-type impurities, while the extrinsic regions 153b and 155b of the second semiconductor islands 151b are doped with N-type impurities, depending on driving conditions. The conductive impurities include P-type impurities such as boron (B) and gallium (Ga), and N-type impurities such as phosphorous (P) and arsenic (As).

A gate insulating layer 140 preferably made of silicon oxide or silicon nitride is formed on the semiconductor islands 151a and 151b and the blocking film 111. At this time, the gate insulating layer 140 may be made as a single-layered structure as shown in FIG. 1, and the gate insulating layer 140 may be made as a double-layered structure including a first gate insulating layer 401 having the same shape as the semiconductor islands 151a and 151b, and a second gate insulating layer 402 which is wholly formed on the insulating substrate 110 as shown in FIG. 5.

A plurality of gate conductors including a plurality of gate lines 121 including a plurality of pairs of first gate electrodes 124a and a plurality of second gate electrodes 124b are formed on the gate insulating layer 140.

The gate lines 121 for transmitting gate signals extend substantially in a transverse direction. Each pair of first gate electrodes 124a protrudes upward from the gate line 121 and they intersect the first semiconductor islands 151a such that they overlap the pair of the first channel regions 154a. Each gate line 121 may include an expanded end portion having a large area for contact with another layer or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that they overlap the second channel regions 154b. The second gate electrodes 124b extend to form storage electrodes 127 overlapping the storage electrode regions 157 of the second semiconductor islands 151b to form storage capacitors Cst.

The gate conductors 121 and 124b are preferably made of a low resistivity material including an Al-containing metal such as Al and an Al alloy (e.g. Al—Nd), an Ag-containing metal such as Ag and an Ag alloy, and a Cu-containing metal such as Cu and a Cu alloy. The gate conductors 121 and 124b may have a multi-layered structure including two films having different physical characteristics. One of the two films is preferably made of a low resistivity metal including an Al-containing metal, an Ag-containing metal, and a Cu-containing metal for reducing signal delay or voltage drop in the gate conductors 121 and 124b. The other film is preferably made of material such as Cr, Mo, a Mo alloy, Ta, or Ti, which have good physical, chemical, and electrical contact characteristics with other materials such as indium tin oxide (ITO) and indium zinc oxide (IZO). Good examples of the combination of the two films are a lower Cr film and an upper Al—Nd alloy film, and a lower Al film and an upper Mo film.

In addition, the lateral sides of the gate conductors 121 and 124b are inclined relative to a surface of the substrate 110, and the inclination angle thereof ranges about 30-80 degrees.

An interlayer insulating film 160 is formed on the gate conductors 121 and 124b. The interlayer insulating layer 160 is preferably made of a photosensitive organic material having a good flatness characteristic, a low dielectric insulating material such as a-Si:C:O and a-Si:O:F formed by plasma enhanced chemical vapor deposition (PECVD), or an inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a, and 165b exposing the source regions 153a and 153b and the drain regions 155a and 155b, respectively.

A plurality of data conductors including a plurality of data lines 171, a plurality of voltage transmission lines 172, and a plurality of first and second drain electrodes 175a and 175b are formed on the interlayer insulating film 160. The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having a large area for contact with another layer or an external driving circuit. The data lines 171 may be directly connected to a data driving circuit for generating the gate signals, which may be integrated on the substrate 110.

The voltage transmission lines 172 for transmitting driving voltages for the driving TFT Qb extend substantially in the longitudinal direction and intersect the gate lines 121. Each voltage transmission line 172 includes a plurality of second source electrodes 173b connected to the second source regions 153b through the contact holes 163b. The voltage transmission lines 171 may be connected to each other.

The first drain electrodes 175a are separated from the data lines 171 and the voltage transmission lines 172, and connected to the first drain regions 155a through the contact holes 165 and to the second gate electrodes 124b through the contact holes 164.

The second drain electrodes 175b are separated from the data lines 171 and the voltage transmission lines 172, and connected to the second drain regions 155b through the contact holes 165b.

The data conductors 171, 172, 175a, and 175b are preferably made of a refractory metal including Cr, Mo, Ti, Ta, or alloys thereof. They may have a multi-layered structure preferably including a low resistivity film and a good contact film. A good example of the multi-layered structure includes a Mo lower film, an Al middle film, and a Mo upper film, as well as the above-described combinations of a Cr lower film and an Al—Nd upper film and an Al lower film and a Mo upper film.

Like the gate conductors 121 and 124b, the data conductors 171, 172, 175a, and 175b have tapered lateral sides relative to the surface of the substrate 110, and the inclination angles thereof range about 30-80 degrees.

A passivation layer 180 is formed on the data conductors 171, 172, 175a, and 175b. The passivation layer 180 is also preferably made of photosensitive organic material having a good flatness characteristic, a low dielectric insulating material such as a-Si:C:O and a-Si:O:F formed by PECVD, or an inorganic material such as silicon nitride and silicon oxide.

The passivation layer 180 has a plurality of contact holes 185 exposing the second drain electrodes 175b. The passivation layer 180 may further include a plurality of contact holes (not shown) exposing end portions of the data lines 171 and the passivation layer 180, and the interlayer insulating layer 160 may have a plurality of contact holes (not shown) exposing end portions of the gate lines 121.

A plurality of pixel electrodes 190 are formed on the passivation layer 180. The pixel electrodes 190 are connected to the second drain electrodes 175b through the contact holes 185, and they are preferably made of at least one of a reflective opaque material such as Al or an Ag alloy. However, the pixel electrode 190 may be made of a transparent conductor such as ITO or IZO and an opaque reflective conductor such as Al, Ag, Ca, Ba, and Mg. The pixel electrode 190 may be incorporated with the second drain electrode 175b for reducing the manufacturing cost.

A plurality of contact assistants or connecting members (not shown) may be also formed on the passivation layer 180 such that they are connected to the exposed end portions of the gate lines 121 or the data lines 171.

A partition 360 for separating pixels of the TFT array panel is formed on the passivation layer 180 and the pixel electrodes 190. The partition 360 surrounds the pixel electrodes 190 like a bank to define openings to be filled with organic light emitting material. The partition 360 is preferably made of an organic insulating material and, more preferably, of a photosensitive material containing a black pigment, which is exposed to light and developed, such that the partition 360 functions as a light blocking member and a manufacturing method thereof is simplified.

A plurality of light emitting members 370 are formed on the pixel electrodes 190 and disposed in the openings defined by the partition 360. The light emitting members 370 are preferably made of an organic material emitting primary-color light such as red, green, and blue light. The red, green, and blue light emitting members 370 are periodically arranged.

A buffer layer (not shown) may be formed on the light emitting members 370 and the partition 360.

A common electrode 270 supplied with a predetermined voltage such as a common voltage is formed on the light emitting members 370 and the partition 360.

The common electrode 270 is preferably made of a transparent conductive material such as ITO and IZO or an opaque metal such as Al, Ag, Ca, Ba, and Mg.

An auxiliary electrode (not shown) made of a low resistivity material is optionally provided for compensating the conductivity of the common electrode 270. The auxiliary electrode may be disposed under or on the common electrode 270, and it preferably has a matrix form and is disposed along the partition 360 such that it does not overlap the light emitting member 370.

In the above-described TFT array panel, a first semiconductor island 151a, a first gate electrode 124a connected to the gate line 121, a first source electrode 153a connected to the data line 171, and a first drain electrode 155a form a switching TFT Qa. In addition, a second semiconductor island 151b, a second gate electrode 124b connected to the first drain electrode 155a, a second source electrode 153b connected to the voltage transmission line 172, and a second drain electrode 155b connected to a pixel electrode 190 form a driving TFT Qb. Furthermore, a pixel electrode 190 and a common electrode 270 serve as an anode and a cathode, respectively, and a storage region 157 connected to a first drain region 155a and a storage electrode 127 connected to a voltage transmission line 172 through a second source electrode 153b form a storage capacitor Cst.

The switching TFT Qa transmits data signals from the data line 171 to the driving TFT Qb in response to the gate signal from the gate line 121. Upon receipt of the data signal, the driving TFT Qb generates a current having a magnitude depending on a voltage difference between the second gate electrode 124b and the second source electrode 173b. In addition, the voltage difference is charged in the storage capacitor Cst to be maintained after the switching TFT Qa is turned off. The current driven by the driving TFT Qb enters into the light emitting member 370 through the pixel electrode 190 and reaches the common electrode 270. The current flowing in the light emitting member 370 means that positive charge carriers such as holes and negative charge carriers such as electrons are injected into the light emitting member 370 from the anode 190 and the cathode 270, respectively, and they are drifted by an electric field generated by the voltage difference between the anode 190 and the cathode 270. The holes and the electrons in the light emitting member 370 then meet each other to be recombined into excitons, which emit light with a predetermined wavelength. The intensity of the emitted light depends on the current driven by the driving TFT Qb and flowing in the light emitting member 370.

The emitted light goes out of the display panel after passing through the common electrode 270 or the pixel electrode 190. A transparent common electrode 270 and an opaque pixel electrode 190 are applicable to a top emission type of EL display, which displays an image on its top surface. On the contrary, a transparent pixel electrode 190 and an opaque common electrode 270 are applicable to a bottom emission type of EL display, which displays an image on its bottom surface.

Now, a method of manufacturing the TFT array panel shown in FIGS. 8-10 is described with reference to FIGS. 14-27B as well as FIGS. 11-13.

FIGS. 14, 16, 18, 20, 22, 24, and 26 are layout views of the TFT array panel shown in FIGS. 8-10 in intermediate steps of a manufacturing method thereof according to an embodiment of the present invention, FIGS. 15A, 17A, 19A, 21A, 23A, 25A, and 27A are sectional views of the TFT array panels shown in FIGS. 14, 16, 18, 20, 22, 24, and 26 taken along the lines XVA-XVA', XVIIA-XVIIA', XIXA-XIXA', XXIA-XXIA', XXIIIA-XXIIIA', XXVA-XXVA', and XXVIIA-XX-VIIA', respectively, and FIGS. 15B, 17B, 19B, 21B, 23B, 25B, and 27B are sectional views of the TFT array panels shown in FIGS. 14, 16, 18, 20, 22, 24, and 26 taken along the lines XVB-XVB', XVIIB-XVIIB', XIXB-XIXB', XXIB-XXIB', XXIIIB-XXIIIB', XXVB-XXVB', and XXVIIB-XX-VIIB', respectively.

A blocking layer 111 is formed on an insulating substrate 110, and a semiconductor layer made of amorphous silicon is deposited on the blocking layer 111, preferably by LPCVD (low temperature chemical vapor deposition), PECVD (plasma enhanced chemical vapor deposition), or sputtering.

Figure 14:
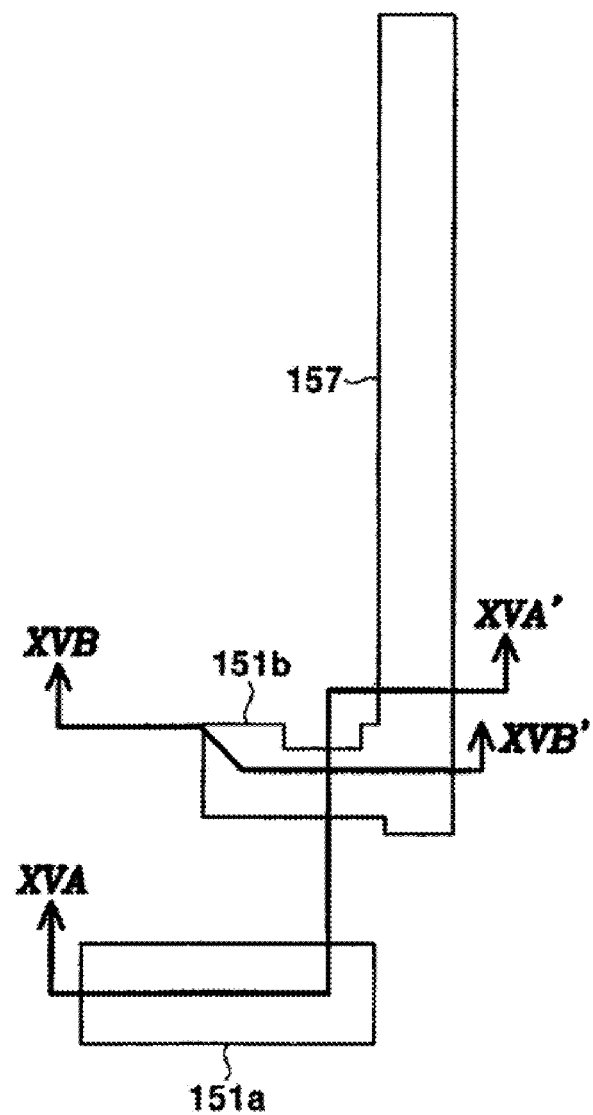
FIGS. 14, 16, 18, 20, 22, 24, and 26 are layout views of intermediate steps of a manufacturing method of the display panel shown in FIGS. 11-13 according to an embodiment of the present invention.
Figure 15A:
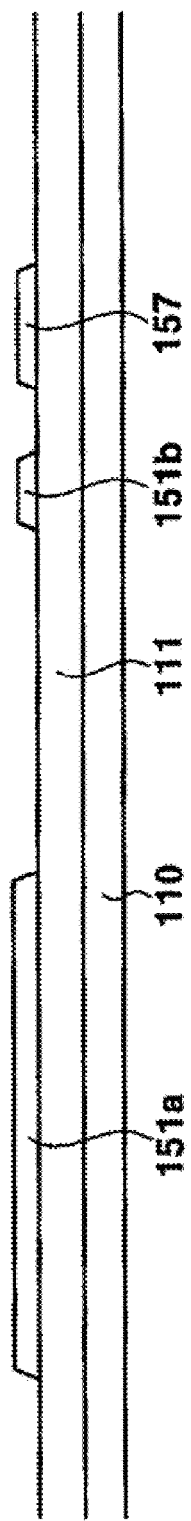
FIGS. 15A and 15B are sectional views of the display panel shown in FIG. 14 taken along the lines XVA-XVA' and XVB-XVB', respectively.
Figure 15B:
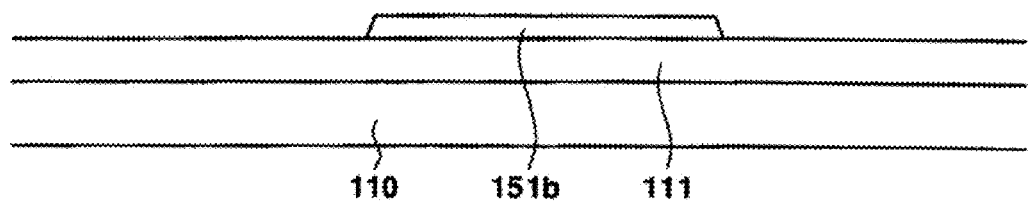

The semiconductor layer is subjected to SLS to be crystallized. Next, the semiconductor layer is photo-etched to form a plurality of pairs of first and second semiconductor islands 151a and 151b as shown in FIGS. 14-15B.

At this time, the first alignment key 500 (referring to FIGS. 3A to 3C) is formed on the edge of the insulating substrate 110. Also, the first gate insulating layer 401 (referring to FIGS. 5 and 6B) may be formed on the first and second semiconductor islands 151a and 151b, and the first alignment keys 500 (referring to FIGS. 8A to 10B) may be formed on the edge of the insulating substrate 110. The first gate insulating layer 401 prevents the surface of the first and second semiconductor islands 151a and 151b from being contaminated.

Figure 16:
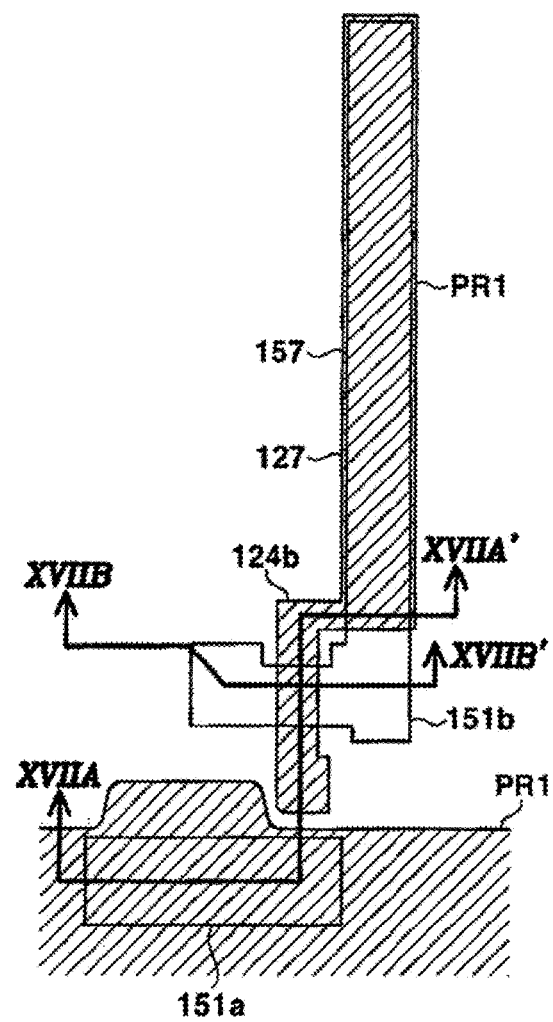
Figure 17A:
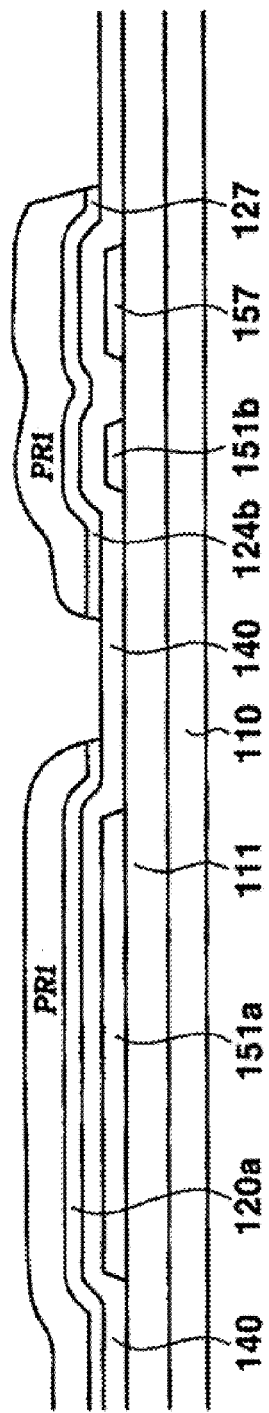
FIGS. 17A and 17B are sectional views of the display panel shown in FIG. 16 taken along the lines XVIIA-XVIIA' and XVIIB-XVIIB', respectively.
Figure 17B:
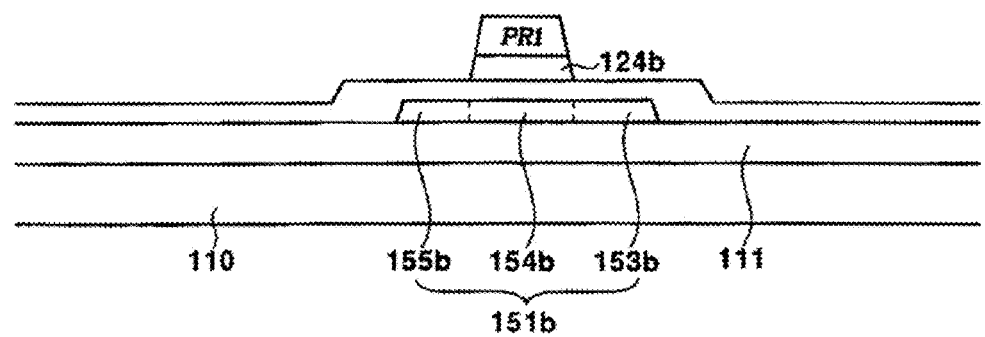

Referring to FIGS. 16-17B, a gate insulating layer 140 and a gate metal layer are sequentially deposited on the gate insulating layer 140, and a first photoresist PR1 is formed thereon. At this time, the second alignment key 54 is formed on the first alignment key 500 to align the first photoresist PR1. On the other hand, when the gate insulating layer 140 includes a first gate insulating layer 401 having the same shape as the semiconductor islands 151a and 151b, and a second gate insulating layer 402 which is wholly formed on the insulating substrate 110 as shown in FIG. 5, the first gate insulating layer 401 may be removed before depositing the second gate insulating layer 402 as shown in FIGS. 7A and 7B. The gate metal layer is etched by using the first photoresist PR1 as an etch mask to form a plurality of gate electrodes 124b including storage electrodes 127 and a plurality of gate metal members 120a.

P-type impurities are introduced into portions of the second semiconductor islands 151b, which are not covered with the gate electrodes 124b and the gate metal members 120a, as well as the first photoresist PR1, to form a plurality of P-type extrinsic regions 153b and 155b. At this time, the first semiconductor islands 151a are covered with the first photoresist PR1 and the gate metal members 120a to be protected from impurity implantation.

Figure 18:
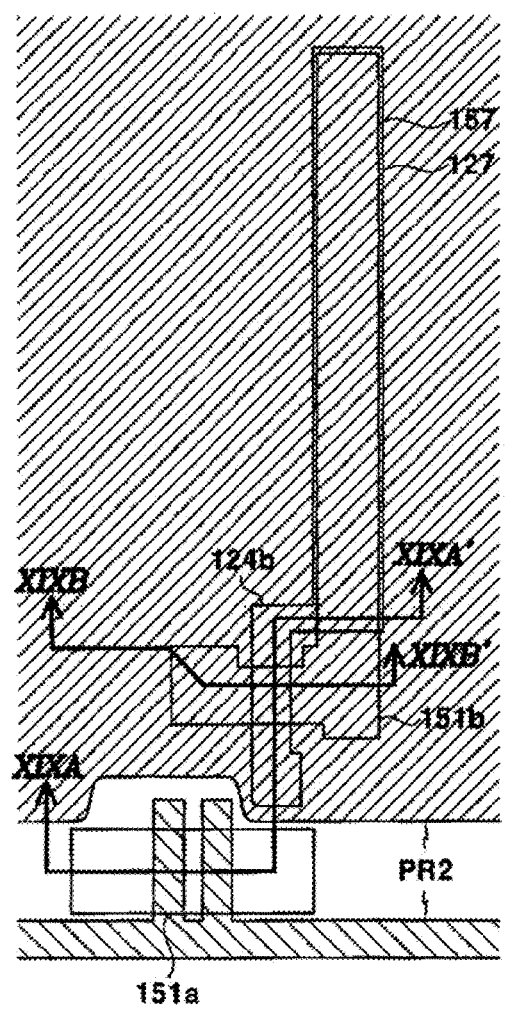
Figure 19A:
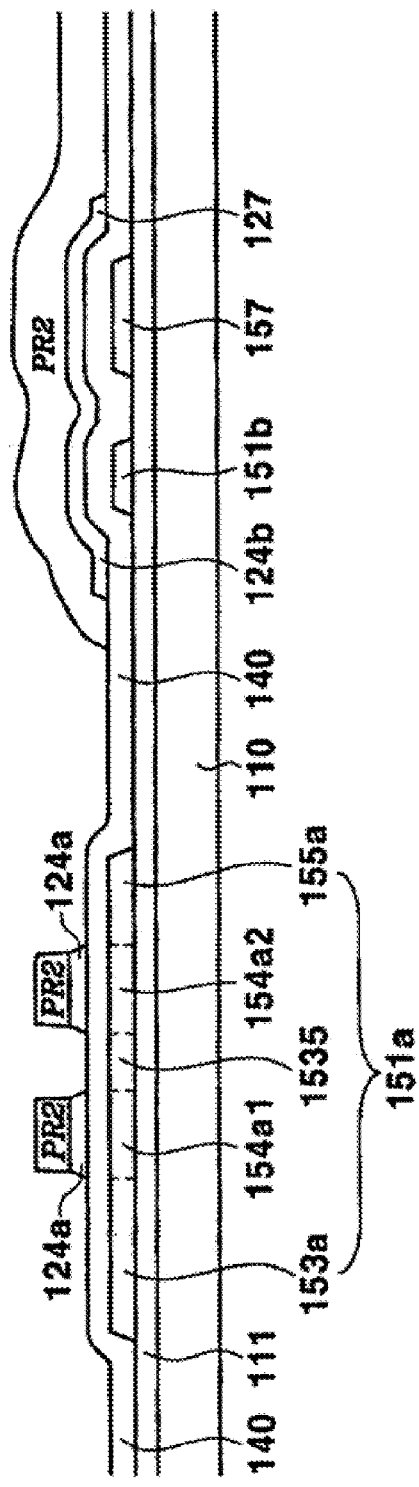
FIGS. 19A and 19B are sectional views of the display panel shown in FIG. 18 taken along the lines XIXA-XIXA' and XIXB-XIXB', respectively.
Figure 19B:
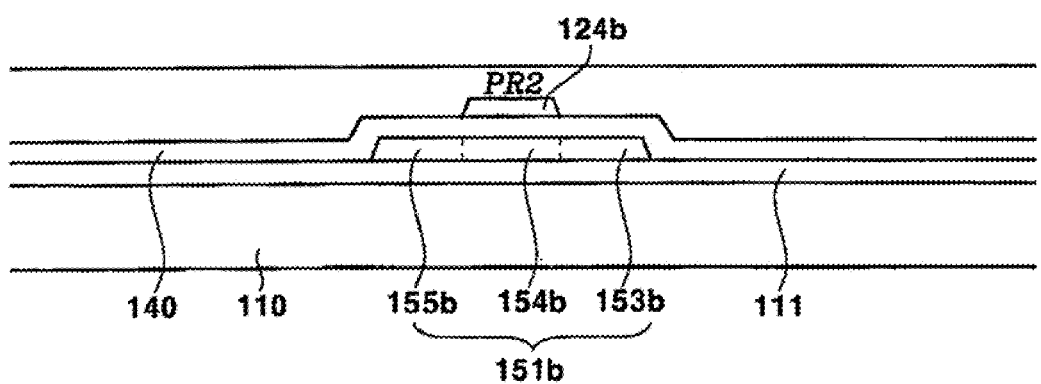

Referring to FIGS. 18-19B, the first photoresist PR1 is removed and a second photoresist PR2 is formed. The gate metal members 120a are etched by using the second photoresist PR2 as an etch mask to form a plurality of gate lines 121 including gate electrodes 124a. N-type impurities are injected into portions of the first semiconductor islands 151a, which are not covered with the gate lines 121 and the gate electrodes 124b, as well as the second photoresist PR2, to form a plurality of N-type extrinsic regions 153a and 155a. At this time, the second semiconductor islands 151b are covered with the second photoresist PR2 to be protected from impurity implantation.

Figure 20:
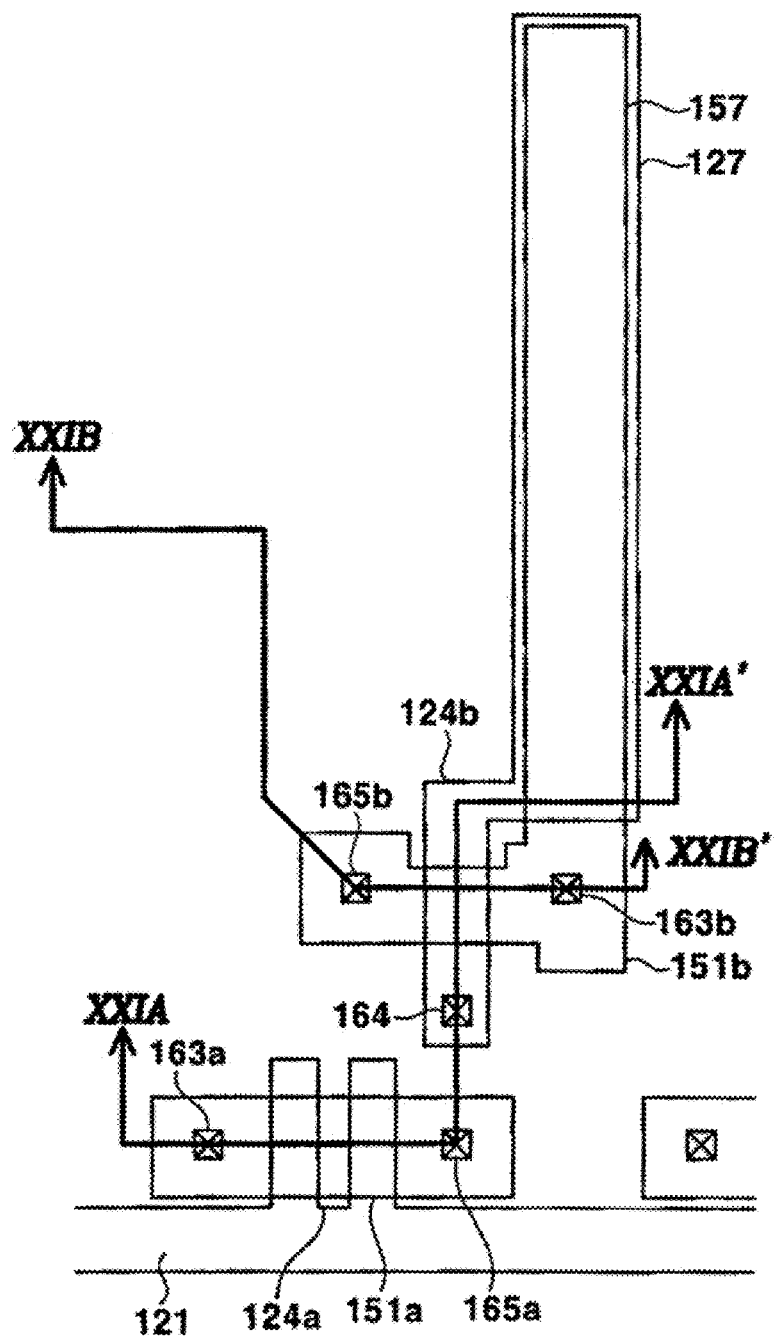
Figure 21A:
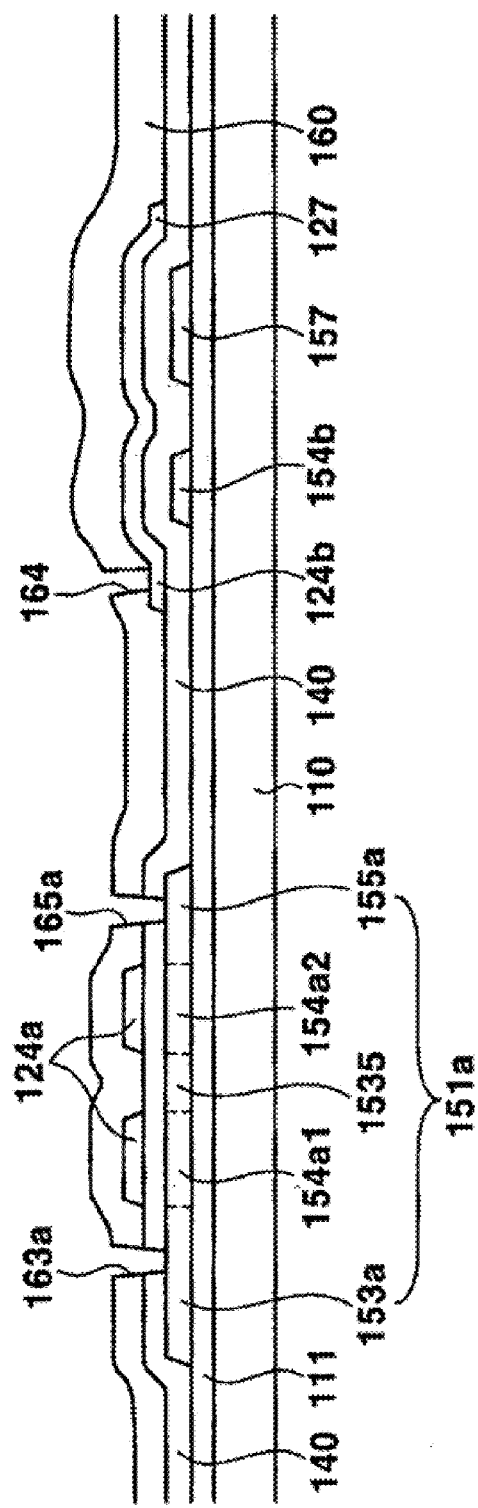
FIGS. 21A and 21B are sectional views of the display panel shown in FIG. 20 taken along the lines XXIA-XXIA' and XXIB-XXIB', respectively.
Figure 21B:
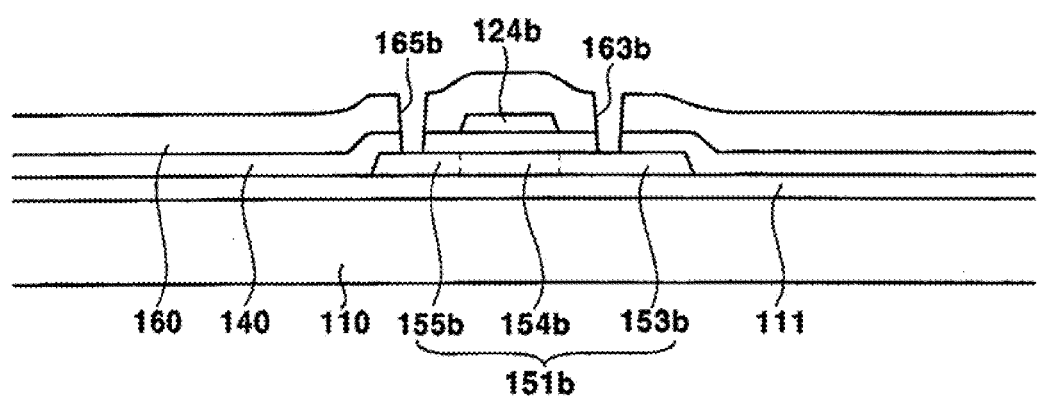

Referring to FIGS. 20-21B, an interlayer insulating film 160 is deposited and the interlayer insulating film 160 and the gate insulating layer 140 are photo-etched to form a plurality of contact holes 163a, 163b, 165a, and 165b exposing the extrinsic regions 153a, 155a, 153b, and 155b, respectively, as well as a plurality of contact holes 164 exposing the gate electrodes 124b.

Figure 22:
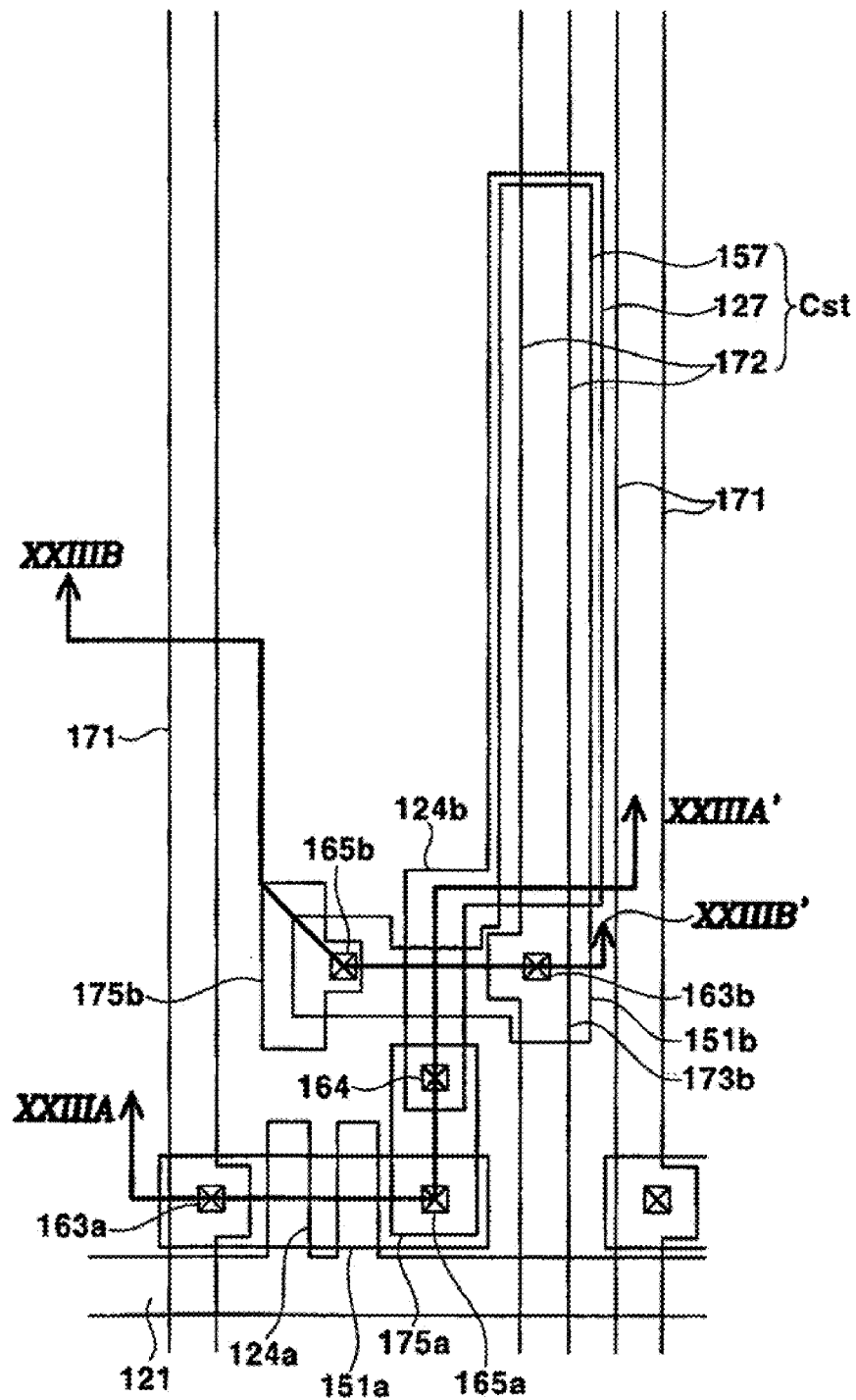
Figure 23A:
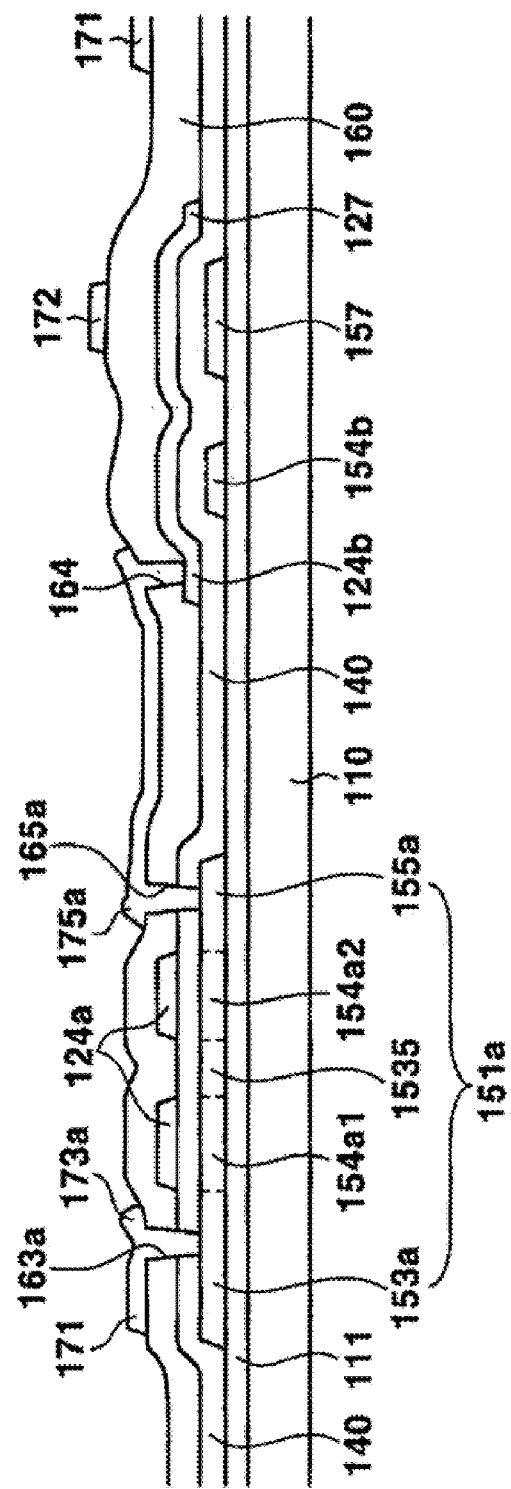
FIGS. 23A and 23B are sectional views of the display panel shown in FIG. 22 taken along the lines XXIIIA-XXIIIA' and XXIIIB-XXIIIB', respectively.
Figure 23B:
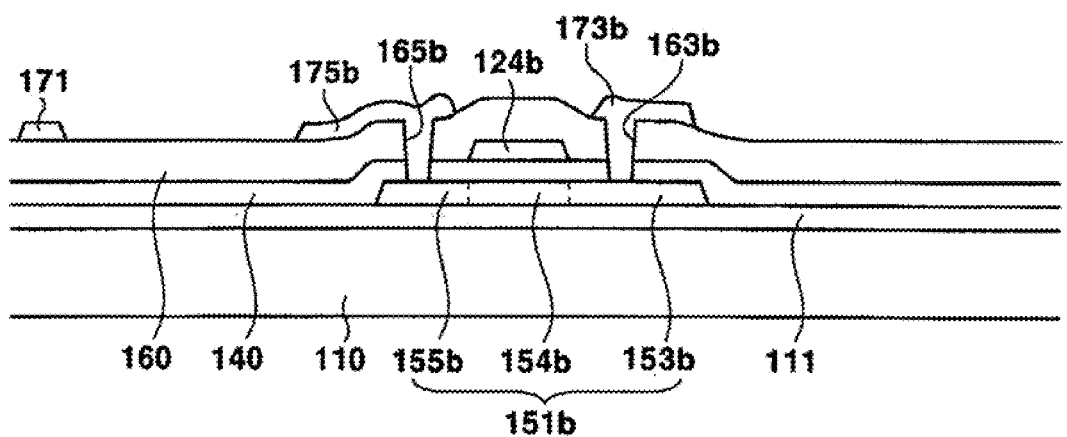

Referring to FIGS. 22-23B, a plurality of data conductors including a plurality of data lines 171 including first source electrodes 173a, a plurality of voltage transmission lines 172, and a plurality of first and second drain electrodes 175a and 175b are formed on the interlayer insulating layer 160.

Figure 24:
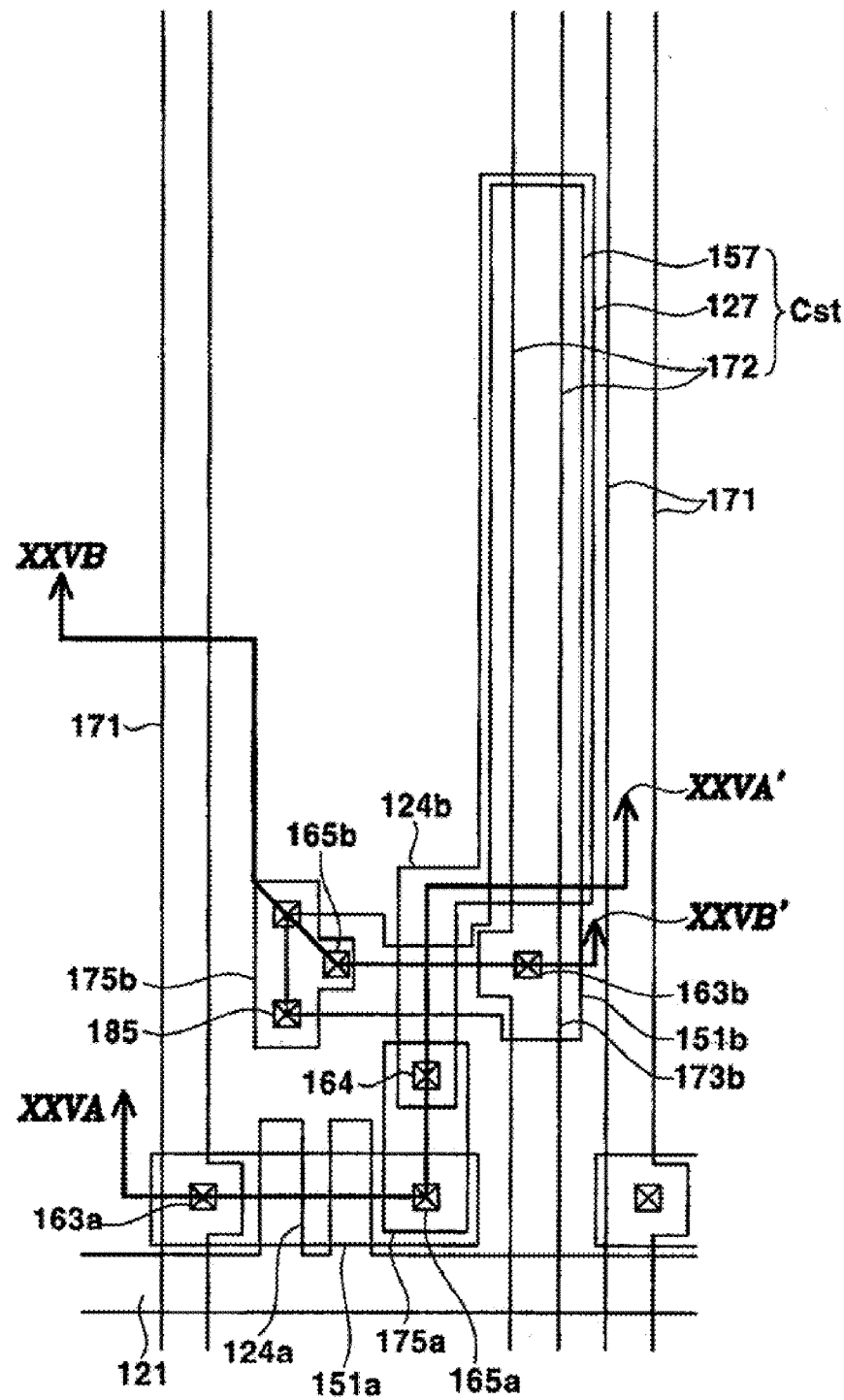
Figure 25A:
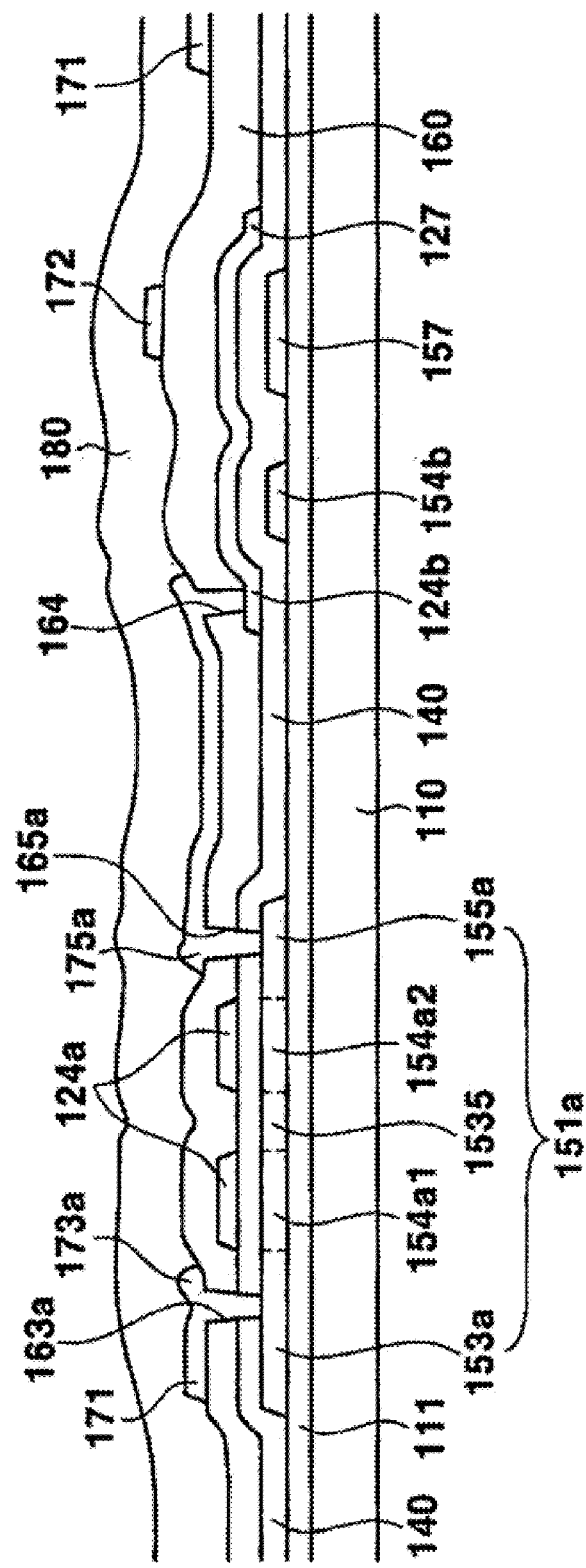
FIGS. 25A and 25B are sectional views of the display panel shown in FIG. 24 taken along the lines XXVA-XXVA' and XXVB-XXVB', respectively.
Figure 25B:
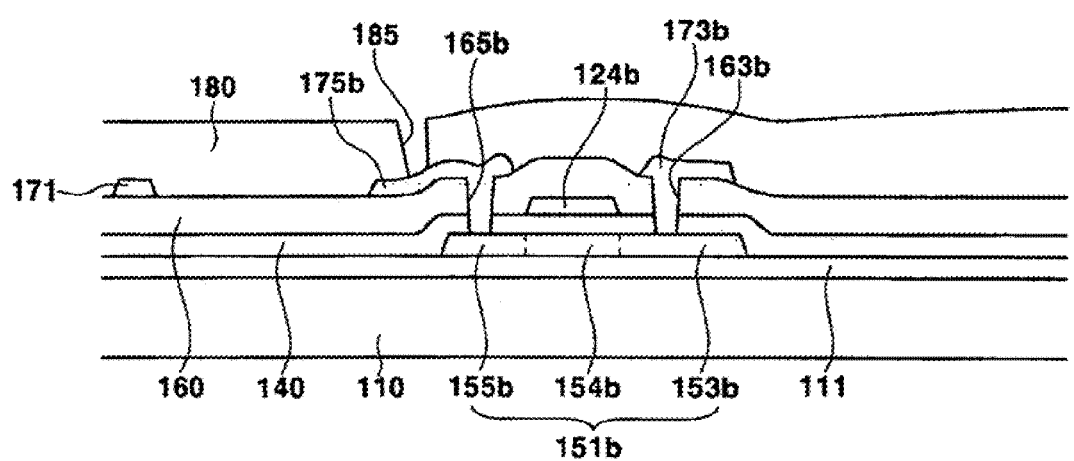

Referring to FIGS. 24-25B, a passivation layer 180 is deposited and is photo-etched to form a plurality of contact holes 185 exposing the second drain electrodes 175b.

Figure 26:
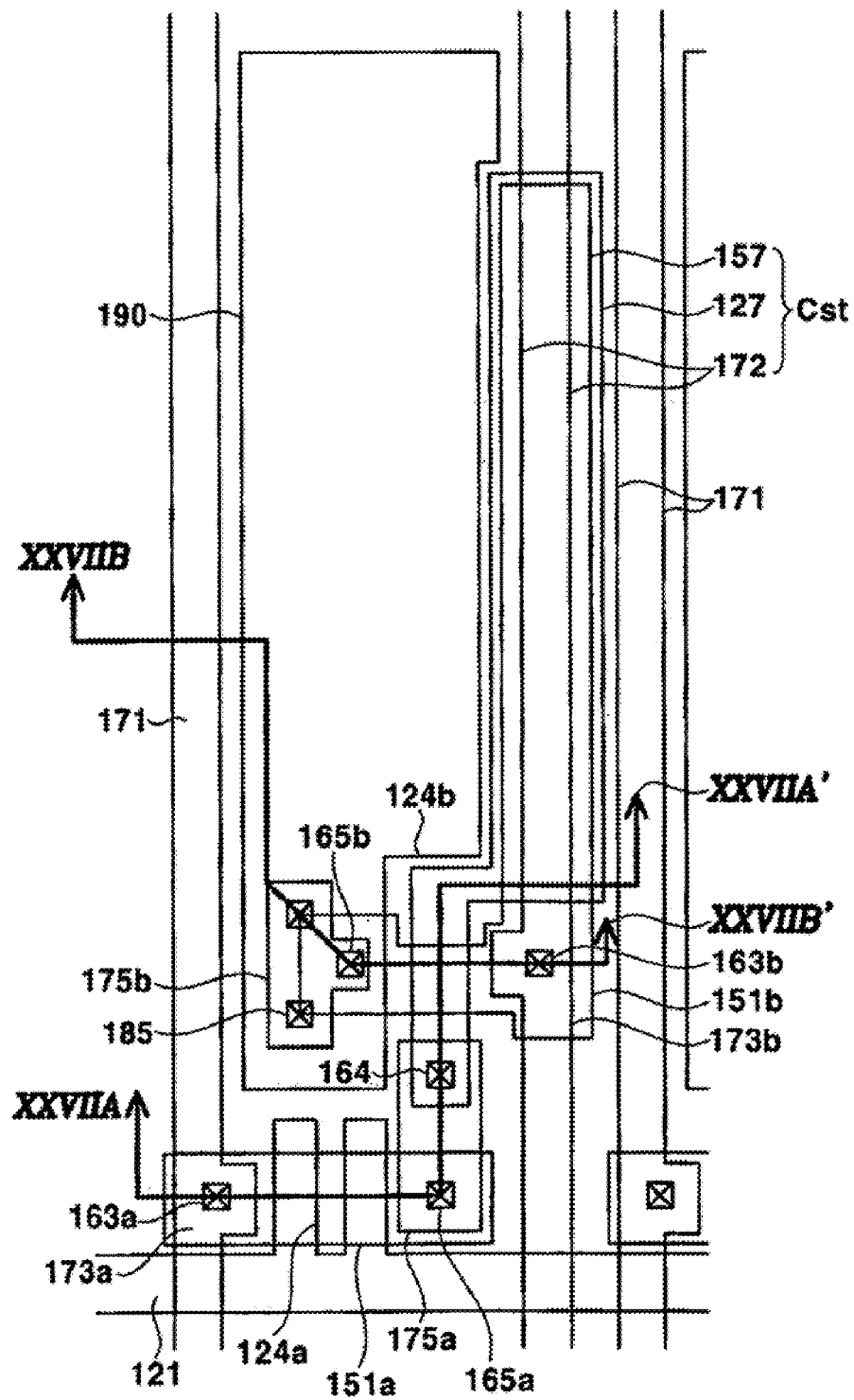
Figure 27A:
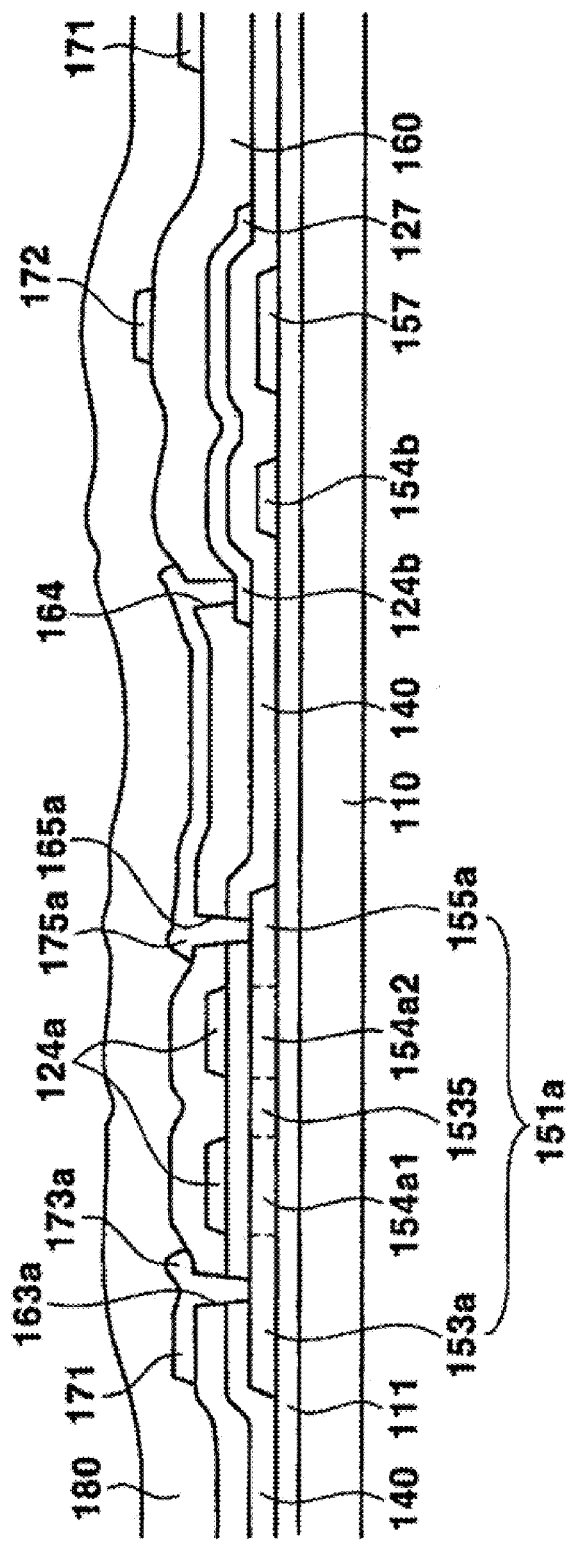
FIGS. 27A and 27B are sectional views of the display panel shown in FIG. 26 taken along the lines XXVIIA-XXVIIA' and XXVIIB-XXVIIB', respectively.
Figure 27B:
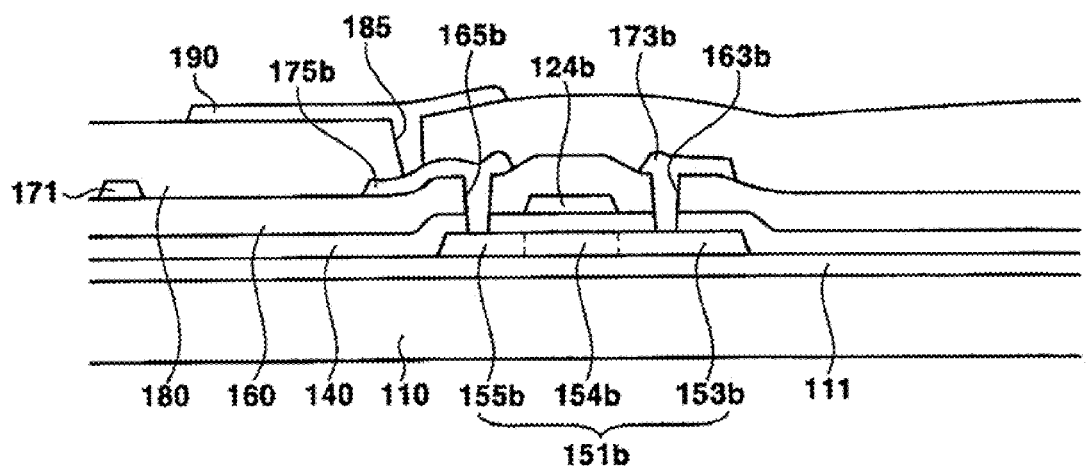

Referring to FIGS. 26-27B, a plurality of pixel electrodes 190 are formed on the passivation layer 180. When the pixel electrodes 190 are made of a reflective opaque material, they may be formed on the data metal layer along with the data lines 171.

Referring to FIGS. 11-13, a photosensitive organic film containing a black pigment is coated on the pixel electrodes 190 and the passivation layer 180, and it is exposed to light and developed to form a partition 360 defining a plurality of openings on the pixel electrodes 190. Thereafter, a plurality of organic light emitting members 370 are formed in the openings by deposition or inkjet printing following masking. The organic light emitting member 370 preferably has a multilayered structure.

Next, a buffer layer (not shown) including a conductive organic material and a common electrode 270 are sequentially formed.

An auxiliary electrode (not shown), preferably made of a low resistivity material such as Al, may be formed before or after the formation of the common electrode 270.

As described above, because the alignment key for interlayer alignment is completely covered, the detection noise due to the protrusions of the polysilicon may be minimized. Accordingly, the photolithography process having the interlayer accuracy alignment between the thin films may be executed.

Also, the etching of the polysilicon layer after it is covered by a gate insulating layer prevents the surface of the semiconductor from being contaminated. Accordingly, the characteristic of the TFT may be improved and uniform.

Because the circumferential portion except for the display portion is intaglio, the detection noise due to the protrusions of the polysilicon may be removed. Accordingly, the photolithography process having the interlayer accuracy alignment between the thin films may be executed.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, comprising:
    forming a semiconductor layer of polysilicon on an insulating substrate;
    forming a gate insulating layer on the semiconductor layer;
    forming a gate electrode on the gate insulating layer;
    forming a source region and a drain region by doping conductive impurities in the semiconductor layer;
    forming an interlayer insulating layer covering the gate electrode;
    forming a source electrode and a drain electrode respectively connected to the source and the drain regions;
    forming a passivation layer covering the source and the drain electrodes;
    forming a pixel electrode connected to the drain electrode; and
    forming a first alignment key when forming one selected from the semiconductor layer, the gate electrode, the source electrode, the drain electrode, and the pixel electrode,
    wherein one selected from the semiconductor layer, the gate electrode, the source electrode, the drain electrode, and the pixel electrode is at least formed by a photolithography process using a photoresist pattern as an etch mask, and a second alignment key completely covering the first alignment key is formed at the same layer as the photoresist pattern.

2. The method of claim 1 wherein the first alignment key includes a display portion representing the shape of the first alignment key, a detection portion defining the outline of the first alignment key, and a circumferential portion disposed between the display portion and the detection portion.

3. The method of claim 2, wherein the detection portion is in relief.

4. The method of claim 2, wherein the detection portion is in intaglio.

5. The method of claim 1, wherein the thin film transistor array panel is a display panel for a liquid crystal display.

6. The method of claim 1, wherein the thin film transistor array panel is a display panel for an organic light emitting display.

* * * * *